(12) United States Patent
Kim

(10) Patent No.: US 10,224,511 B2
(45) Date of Patent: Mar. 5, 2019

(54) ORGANIC LIGHT EMITTING DISPLAY DEVICE

(71) Applicant: Samsung Display Co., Ltd., Yongin-si, Gyeonggi-Do (KR)

(72) Inventor: Mu-Gyeom Kim, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/365,629

(22) Filed: Nov. 30, 2016

(65) Prior Publication Data
US 2017/0222187 A1    Aug. 3, 2017

(30) Foreign Application Priority Data
Feb. 1, 2016    (KR) .................. 10-2016-0012253

(51) Int. Cl.
H01L 51/52    (2006.01)
H01L 27/32    (2006.01)

(52) U.S. Cl.
CPC ...... *H01L 51/5271* (2013.01); *H01L 27/3258* (2013.01); *H01L 27/3262* (2013.01); *H01L 51/5203* (2013.01); *H01L 27/322* (2013.01)

(58) Field of Classification Search
CPC ............. H01L 51/5271; H01L 51/5203; H01L 27/322; H01L 27/3262
See application file for complete search history.

(56) References Cited

U.S. PATENT DOCUMENTS

| | | | | |
|---|---|---|---|---|
| 5,926,240 A * | 7/1999 | Hirota | ............... | G02F 1/133553 349/114 |
| 6,961,032 B2 * | 11/2005 | Winters | ............... | G09G 3/3233 345/76 |
| 7,129,634 B2 * | 10/2006 | Boroson | ............. | H01L 27/3213 313/504 |
| 7,362,387 B2 * | 4/2008 | Jung | ................... | B01J 19/0046 349/2 |
| 7,602,463 B2 * | 10/2009 | Tsuchiya | ........... | G02F 1/133555 349/117 |
| 8,199,298 B2 * | 6/2012 | Otake | ............... | G02F 1/133555 349/114 |
| 8,269,227 B2 * | 9/2012 | Yamazaki | ............. | H01L 27/322 257/100 |
| 8,310,149 B2 | 11/2012 | Lifka et al. | | |
| 8,415,658 B2 * | 4/2013 | Kashiwabara | ...... | H01L 27/3244 257/40 |
| 8,445,911 B2 * | 5/2013 | Yang | .................... | H01L 27/1255 257/291 |
| 8,809,863 B2 * | 8/2014 | Kim | .................... | H01L 51/5265 257/59 |
| 9,780,148 B2 * | 10/2017 | Pyo | ..................... | H01L 27/3211 |

(Continued)

FOREIGN PATENT DOCUMENTS

JP     2006269326 A  * 10/2006
KR    10-2016-0035175 A    3/2016

*Primary Examiner* — Ida M Soward
(74) *Attorney, Agent, or Firm* — Innovation Counsel LLP

(57) ABSTRACT

An organic light emitting display device includes a substrate, a dielectric mirror structure, a reflection pattern, and a pixel structure. The substrate includes a first region and a second region adjacent to the first region. The dielectric mirror structure is disposed on the substrate. The reflection pattern is disposed in the second region on the substrate. The pixel structure is disposed in the first region on the substrate.

20 Claims, 17 Drawing Sheets

(56) References Cited

U.S. PATENT DOCUMENTS

| | | | |
|---|---|---|---|
| 2004/0149989 A1* | 8/2004 | Matsunaga | H01L 27/1218 257/59 |
| 2004/0217694 A1* | 11/2004 | Cok | G09G 3/3216 313/504 |
| 2007/0182892 A1* | 8/2007 | Higa | G02F 1/133555 349/114 |
| 2007/0252155 A1* | 11/2007 | Cok | H01L 51/5203 257/79 |
| 2009/0294906 A1* | 12/2009 | Suzuki | H01L 27/11507 257/532 |
| 2010/0123142 A1* | 5/2010 | Ryu | H01L 51/5246 257/88 |
| 2012/0153309 A1* | 6/2012 | Kim | G02B 26/0841 257/88 |
| 2013/0016296 A1* | 1/2013 | Fujita | H01L 27/322 349/42 |
| 2015/0243224 A1* | 8/2015 | Zhuang | G02F 1/13306 345/102 |
| 2016/0035940 A1* | 2/2016 | Fujita | H01L 33/005 438/29 |
| 2017/0010734 A1* | 1/2017 | Liu | G06F 3/044 |
| 2017/0090182 A1* | 3/2017 | Steyn | H01L 27/1259 |

* cited by examiner

ORGANIC LIGHT EMITTING DISPLAY DEVICE

CROSS-REFERENCE TO RELATED APPLICATION(S)

This application claims priority under 35 USC § 119 to Korean Patent Applications No. 10-2016-0012253, filed on Feb. 1, 2016 in the Korean Intellectual Property Office (KIPO), the contents of which are incorporated herein in its entirety by reference.

BACKGROUND

1. Field

Example embodiments relate generally to organic light emitting display devices. More particularly, embodiments of the present inventive concept relate to organic light emitting display devices including a reflection pattern.

2. Description of the Related Art

A flat panel display (FPD) device is widely used as a display of an electronic device because the FPD device is lightweight and thin compared to a cathode-ray tube (CRT) display device. Typical examples of the FPD device are a liquid crystal display (LCD) device and an organic light emitting display (OLED) device. Compared to the LCD device, the OLED device has many advantages such as a higher luminance and a wider viewing angle. In addition, the OLED device can be made thinner because the OLED device does not require a backlight. In the OLED device, electrons and holes are injected into an organic thin layer through a cathode and an anode, and then recombined in the organic thin layer to generate excitons, such that light of a certain wavelength can be emitted.

Recently, a mirror OLED device capable of reflecting an image of an object (or a target) located at the front of the OLED device has been developed, by including a pixel structure and a reflection pattern. In this case, since a reflection pattern includes a material that has a high reflective index such as a metal, various reflection colors may not be implemented in the mirror OLED device.

SUMMARY

Some example embodiments provide an organic light emitting display device capable of reflecting an image of an object that is located in the front.

According to some aspect of example embodiments, an organic light emitting display (OLED) device includes a substrate, a dielectric mirror structure, a reflection pattern, and a pixel structure. The substrate includes a first region and a second region adjacent to the first region. The dielectric mirror structure is disposed on the substrate. The reflection pattern is disposed in the second region and on the substrate. The pixel structure is disposed in the first region and on the substrate.

In example embodiments, the pixel structure may include a lower electrode, a light emitting layer, and an upper electrode. The lower electrode may be disposed on the dielectric mirror structure, and be light-transmissive. The light emitting layer may be disposed on the lower electrode. The upper electrode may be disposed on the light emitting layer, and may be reflective and positioned to reflect a light emitted from the light emitting layer.

In example embodiments, the upper electrode may be disposed in the first region, but not in the second region. The reflection pattern may be disposed in the second region on the dielectric mirror structure, and the upper electrode and the reflection pattern may be simultaneously formed using the same material.

In example embodiments, the reflection pattern may overlap the dielectric mirror structure in the second region, and the upper electrode may extend in a direction from the first region into the second region. The upper electrode and the reflection pattern may be integrally formed using the same material.

In example embodiments, the reflection pattern may be disposed in the second region on the dielectric mirror structure, and the upper electrode may extend in a direction from the first region into the second region. The upper electrode may be disposed on the reflection pattern, and the lower electrode and the reflection pattern may be simultaneously formed using the same material.

In example embodiments, the dielectric mirror structure may include a first dielectric layer, a second dielectric layer, and a third dielectric layer. The first dielectric layer may be disposed on the substrate, and may have a first refractive index. The second dielectric layer may be disposed on the first dielectric layer, may have the second refractive index that is different from the first refractive index. The third dielectric layer may be disposed on the second dielectric layer, may have the first refractive index.

In example embodiments, the substrate may further include a third region adjacent to the first region. The first region may be located between the second region and the third region.

In example embodiments, the OLED device may further include a semiconductor element in the third region and on the substrate. The semiconductor element may include an active layer between the first dielectric layer and the second dielectric layer, a gate electrode between the second dielectric layer and the third dielectric layer, and source and drain electrodes on the third dielectric layer.

In example embodiments, the reflection pattern may include a first reflection pattern in the second region between the substrate and the first dielectric layer and a second reflection pattern in the third region between the substrate and the first dielectric layer.

In example embodiments, the first and second reflection layers may be integrally formed, and may have a mesh structure including an opening that exposes the first region.

In example embodiments, the first and second reflection patterns may be spaced apart from each other, and each of the first and second reflection patterns may have a planar shape.

In example embodiments, the OLED device may further include a color filter. The color filter may be disposed in the first region and on the third dielectric layer, and may overlap the pixel structure.

In example embodiments, the reflection pattern and the gate electrode may be located at the same level, and may be simultaneously formed using the same material.

In example embodiments, the OLED device may further include a color filter. The color filter may be disposed in the first region on the third dielectric layer, and may overlap the pixel structure.

In example embodiments, the reflection pattern and the source and drain electrodes may be located at the same level, and may be simultaneously formed using the same materials.

In example embodiments, the OLED device may further include color filter. The color filter may be disposed in the first region on the third dielectric layer, and may overlap the pixel structure.

In example embodiments, the pixel structure may include a lower electrode, a light emitting layer, and an upper electrode. The lower electrode may be disposed on the substrate, and may be light-transmissive. The light emitting layer may be disposed on the lower electrode. The upper electrode may be disposed on the light emitting layer, and may be reflective and positioned to reflect light emitted from the light emitting layer. The dielectric mirror structure may be disposed in the second region, and may expose the first region.

In example embodiments, the upper electrode may be disposed in the first region, and may expose the second region. The reflection pattern may be disposed in the second region and on the dielectric mirror structure, and the upper electrode and the reflection pattern may be simultaneously formed using the same material.

In example embodiments, the substrate may further include a third region adjacent to the first region. The first region may be located between the second region and the third region.

In example embodiments, the OLED device may further include a sub-reflection pattern in the third region on the substrate and a semiconductor element on the sub-reflection pattern.

As an OLED device according to example embodiments includes the dielectric mirror structure and the reflection pattern, an image of an object that is located in the front of the OLED device may be reflected as a predetermined reflection color. Accordingly, the OLED device may serve as a mirror OLED device, which has a predetermined reflection color, of a bottom emission structure.

BRIEF DESCRIPTION OF THE DRAWINGS

Example embodiments can be understood in more detail from the following description taken in conjunction with the accompanying drawings, in which.

DETAILED DESCRIPTION OF THE EMBODIMENTS

Hereinafter, embodiments of the present inventive concept will be explained in detail with reference to the accompanying drawings.

Figure 1:
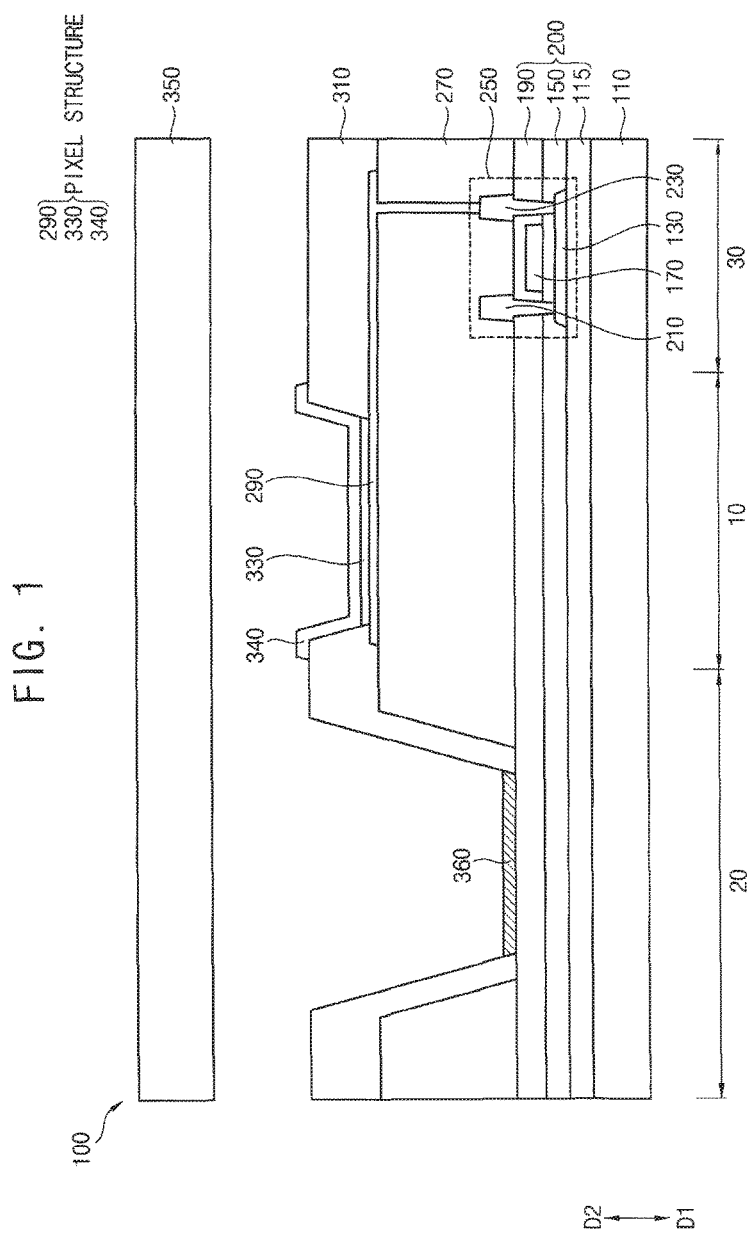
FIG. 1 is a cross-sectional view illustrating an organic light emitting display (OLED) device in accordance with example embodiments.

FIG. 1 is a cross-sectional view illustrating an organic light emitting display (OLED) device in accordance with example embodiments.

Referring to FIG. 1, an OLED device 100 may include a substrate 110, a dielectric mirror structure 200, a semiconductor element 250, a planarization layer 270, a pixel structure, a reflection pattern 360, a pixel defining layer 310, an encapsulation substrate 350, etc. Here, the semiconductor element 250 may include an active layer 130, a gate electrode 170, a source electrode 210, and a drain electrode 230, and the pixel structure may include a lower electrode 290, a light emitting layer 330, and an upper electrode 340. In addition, the dielectric mirror structure 200 may include a first dielectric layer 115, a second dielectric layer 150, and a third dielectric layer 190.

The OLED device 100 may include a first region 10 (e.g., a pixel region), a second region 20 (e.g., a reflection pattern region), and a third region 30 (e.g., a semiconductor element region). The first region 10 may be located between the second region 20 and the third region 30. The pixel structure may be disposed in the first region 10, and a displaying image may be displayed in a first direction D1 from the encapsulation substrate 350 into the substrate 110. In addition, the reflection pattern 360 may be disposed in the second region 20, and an image of an object (e.g., a target located toward the first direction D1 from the substrate 110) that is located in the front of the OLED device 100 may be displayed in the first direction D1. Further, the semiconductor element 250 may be disposed in the third region 30, and the dielectric mirror structure 200 may be entirely disposed in the first region 10, the second region 20, and the third region 30 on the substrate 110. The OLED device 100 may serve as a mirror OLED device with a bottom emission structure, which may reflect various colors.

The substrate 110 may be formed of transparent materials. For example, the substrate 110 may include a quartz substrate, a synthetic quartz substrate, a calcium fluoride substrate, a fluoride-doping quartz substrate, a soda lime substrate, a non-alkali substrate etc. Alternatively, the substrate 110 may be formed of a flexible transparent material such as a flexible transparent resin substrate (e.g., a polyimide substrate). For example, the polyimide substrate may include a first polyimide layer, a barrier film layer, a second polyimide layer, etc. Since the polyimide substrate is relatively thin and flexible, the polyimide substrate may be disposed on a rigid glass substrate to help support the formation of the semiconductor element 250 and the pixel structure. That is, the substrate 110 may have a structure in which the first polyimide layer, the barrier film layer and the second polyimide layer are stacked on the rigid glass substrate. In manufacturing the OLED device 100, after the first dielectric layer 115 is provided on the second polyimide layer of the polyimide substrate, the semiconductor element 250 and the pixel structure (e.g., the lower electrode 290, the light emitting layer 330, and the upper electrode 340, etc) may be disposed on the first dielectric layer 115. After the semiconductor element 250 and the pixel structure are formed on the first dielectric layer 115, the rigid glass substrate on which the polyimide substrate is disposed may be removed. It may be difficult to directly form the semiconductor element 250 and the pixel structure on the polyimide substrate because the polyimide substrate is relatively thin and flexible. Accordingly, the semiconductor element 250 and the pixel structure are formed on the polyimide substrate and the rigid glass substrate, and then the polyimide substrate may serve as the substrate 110 of the OLED device 100 after the removal of the rigid glass substrate. As the OLED device 100 includes the first region 10, the second region 20, and the third region 30, the substrate 110 may also include the first region 10, the second region 20, and the third region 30.

The first dielectric layer 115 may be disposed on the substrate 110. The first dielectric layer 115 may be disposed on the entire substrate 110. In example embodiments, the first dielectric layer 115 may have a first refractive index. For example, the first dielectric layer 115 may have the first refractive index which is determined by controlling a weight ratio of materials included in the first dielectric layer 115, or by controlling a thickness of the first dielectric layer 115. The first dielectric layer 115 may serve as a buffer layer. For example, the first dielectric layer 115 may prevent the diffusion of metal atoms and/or impurities from the substrate 110 into the semiconductor element 250. Additionally, the first dielectric layer 115 may control a rate of a heat transfer in a crystallization process for forming the active layer 130, thereby obtaining a substantially uniform active layer. Furthermore, the first dielectric layer 115 may improve a surface flatness of the substrate 110 when a surface of the substrate 110 is relatively uneven. According to a type of the substrate 110, at least two first dielectric layers 115 may be provided on the substrate 110. For example, the first dielectric layer 115 may include silicon compound, metal oxide, and the like. For example, the first dielectric layer 115 may be formed of silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), titanium oxide (TiOx), and the like.

The active layer 130 may be disposed in the third region 30 on the first dielectric layer 115. For example, the active layer 130 may be formed of an oxide semiconductor, an inorganic semiconductor (e.g., amorphous silicon, polysilicon, etc.), an organic semiconductor, and the like.

The second dielectric layer 150 may be disposed on the first dielectric layer 115 and the active layer 130. The second dielectric layer 150 may cover the active layer 130 in the third region 30 on the substrate 110, and may be disposed on the entire substrate 110. In example embodiments, the second dielectric layer 150 may have a second refractive index that is different from the first refractive index. The second dielectric layer 150 may have the second refractive index which is determined by controlling weight ratio of materials included in the second dielectric layer 150, or by controlling a thickness of the second dielectric layer 150. For example, the first refractive index may be a high refractive index, and the second refractive index may be a low refractive index. Alternatively, the first refractive index may be a low refractive index, and the second refractive index may be a high refractive index. The second dielectric layer 150 may serve as a gate insulation layer. For example, the second dielectric layer 150 may sufficiently cover the active layer 130, and may have a substantially even surface without a step around the active layer 130. Alternatively, the second dielectric layer 150 may cover the active layer 130, and may be disposed as a substantially uniform thickness along a profile of the active layer 130. The second dielectric layer 150 may be formed of silicon compound, metal oxide, etc. For example, the second dielectric layer 150 may include SiOx, SiNx, SiOxNy, SiOxCy, SiCxNy, AlOx, AlNx, TaOx, HfOx, ZrOx, TiOx, and the like.

The gate electrode 170 may be disposed in the third region 30 on the second dielectric layer 150. The gate electrode 170 may be located on a portion of the second dielectric layer 150 under which the active layer 130 is disposed, so that the gate electrode 170 overlaps the active layer 130 in a planar view. The gate electrode 170 may include a metal, a metal alloy, metal nitride, conductive metal oxide, transparent conductive materials, and the like. For example, the gate electrode 170 may be formed of gold (Au), silver (Ag), aluminum (Al), an alloy of aluminum, aluminum nitride (AlNx), silver (Ag), an alloy of silver, tungsten (W), tungsten nitride (WNx), copper (Cu), an alloy of copper, nickel (Ni), chrome (Cr), chrome nitride (CrNx), molybdenum (Mo), an alloy of molybdenum, titanium (Ti), titanium nitride (TiNx), platinum (Pt), tantalum (Ta), tantalum nitride (TaNx), neodymium (Nd), scandium (Sc), strontium ruthenium oxide (SRO), zinc oxide (ZnOx), stannum oxide (SnOx), indium oxide (InOx), gallium oxide (GaOx), indium tin oxide (ITO), indium zinc oxide (IZO), and the like. These may be used alone or in a suitable combination thereof. Alternatively, the gate electrode 170 may have a multi-layered structure.

The third dielectric layer 190 may be disposed on the second dielectric layer 150 and the gate electrode 170. The third dielectric layer 190 may cover the gate electrode 170 in the third region 30 on the substrate 110, and may be disposed on the entire substrate 110. In example embodiments, the third dielectric layer 190 may have the first refractive index. The third dielectric layer 190 may have the first refractive index which is determined by controlling a weight ratio of materials included in the third dielectric layer 190, or by controlling a thickness of the third dielectric layer 190. The third dielectric layer 190 may serve as an insulating interlayer. For example, the third dielectric layer 190 may sufficiently cover the gate electrode 170, and may have a substantially even surface without a step around the gate electrode 170. Alternatively, the third dielectric layer 190 may cover the gate electrode 170, and may be disposed as a substantially uniform thickness along a profile of the gate electrode 170. The third dielectric layer 190 may be formed of silicon compound, metal oxide, and the like. Accordingly, the dielectric mirror structure 200 including the first dielectric layer 115, the second dielectric layer 150, and the third dielectric layer 190 may be disposed.

The source electrode 210 and the drain electrode 230 may be disposed on the third dielectric layer 190. The source electrode 210 may be in contact with a first side of the active layer 130 via a contact hole formed by removing a portion of the second dielectric layer 150 and the third dielectric layer 190 each. The drain electrode 230 may be in contact with a second side of the active layer 130 via a contact hole formed by removing a portion of the second dielectric layer 150 and the third dielectric layer 190 each. Each of the source and drain electrodes 210 and 230 may include a metal, a metal alloy, metal nitride, conductive metal oxide, transparent conductive materials, and the like. These may be used alone or in a suitable combination thereof. Alternatively, each of the source and drain electrodes 210 and 230 may have a multi-layered structure. Accordingly, the semiconductor element 250 including the active layer 130, the gate electrode 170, the source electrode 210, and the drain electrode 230 may be disposed. In some example embodiments, the dielectric mirror structure 200 may be included in a configuration of the semiconductor element 250.

The planarization layer 270 may be disposed on the source and drain electrodes 210 and 230 and the third dielectric layer 190. The planarization layer 270 may have a first opening exposing the third dielectric layer 190 in the second region 20. For example, the planarization layer 270 may be disposed with a relatively high thickness to sufficiently cover the source and drain electrodes 210 and 230 and the third dielectric layer 190. In this case, the planarization layer 270 may have a substantially even upper surface, and a planarization process may be further performed on the planarization layer 270 to achieve the even upper surface of the planarization layer 270. Alternatively, the planarization layer 270 may cover the source and drain electrodes 210 and 230 and the third dielectric layer 190, and may be disposed as a substantially uniform thickness along a profile of the source and drain electrodes 210 and 230 and the third dielectric layer 190. The planarization layer 270 may include organic materials or inorganic materials. In example embodiments, the planarization layer 270 may include the organic materials, and may be formed of a photoresist, a polyacryl-based resin, a polyimide-based resin, a polyamide-based resin, a siloxane-based resin, an acryl-based resin, an epoxy-based resin, and the like.

The lower electrode 290 may be disposed in the first region 10 and the third region 30 on the planarization layer 270. For example, a thickness of the lower electrode 290 may be less than that of the upper electrode 340 such that a light emitted from the light emitting layer 330 is transmitted in the first direction D1. The lower electrode 290 may be in contact with the drain electrode 230 via a contact hole formed by removing a portion of the planarization layer 270. In addition, the lower electrode 290 may be electrically connected to the semiconductor element 250. The lower electrode 290 may be substantially transparent. For example, the lower electrode 290 may include a metal, a metal alloy, metal nitride, conductive metal oxide, transparent conductive materials, and the like. In some example embodiments, the lower electrode 290 may have a multi-layered structure.

The pixel defining layer 310 may be disposed on a portion of the lower electrode 290, the planarization layer 270, and a portion of the third dielectric layer 190 such that the third dielectric layer 190 disposed in the second region 20 is exposed. For example, the pixel defining layer 310 may cover both lateral portions of the lower electrode 290. In addition, the pixel defining layer 310 may cover a side wall (e.g., a side wall of the planarization layer 270) of the first opening of the planarization layer 270, and may be disposed on at least a portion of an upper surface of the third dielectric layer 190 located in the second region 20. The pixel defining layer 310 may have a second opening exposing the third dielectric layer 190 located in the second region 20 on the substrate 110. A size of the second opening may be less than that of the first opening. The light emitting layer 330 may be located on the lower electrode 290 where at least a portion of the light emitting layer 330 and at least a portion of the lower electrode 290 are exposed by the pixel defining layer 310. The pixel defining layer 310 may include organic materials or inorganic materials. In example embodiments, the pixel defining layer 310 may include organic materials.

The light emitting layer 330 may be disposed on the lower electrode 290 such that at least a portion of the lower electrode 290 is exposed. The light emitting layer 330 may have a multi-layered structure including an emission layer (EL), a hole injection layer (HIL), a hole transfer layer (HTL), an electron transfer layer (ETL), an electron injection layer (EIL), and the like. The HIL, the HTL, the EL, the ETL, and the EIL may be sequentially disposed between the lower electrode 290 and the upper electrode 340. The EL of the light emitting layer 330 may be formed using at least one of light emitting materials capable of generating different colors of light (e.g., a red color of light, a blue color of light, and a green color of light, and the like.). Alternatively, the EL of the light emitting layer 330 may generally generate a white color of light by stacking a plurality of light emitting materials capable of generating different colors of light such as a red color of light, a green color of light, a blue color of light, and the like. In this case, a color filter may be disposed under the light emitting layer 330 (e.g., the color filter overlaps the light emitting layer 330 on the third dielectric layer 190). The color filter may include at least one selected from a red color filter, a green color filter, and a blue color filter. Alternatively, the color filter may include at least one selected from a yellow color filter, a cyan color filter, and a magenta color filter. The color filter may be formed of a photosensitive resin (or color photoresist), etc.

The upper electrode 340 may be disposed in the first region 10 on the pixel defining layer 310 and the light emitting layer 330, and may expose the third dielectric layer 190 disposed in the second region 20 on the substrate 110. The OLED device 100 may display a displaying image toward the first direction D1 in the first region 10 (e.g., a bottom emission structure). Thus, a thickness of the upper electrode 340 may be greater than that of the lower electrode 290 such that light emitted from the light emitting layer 330 is reflected from the upper electrode 340 in the first direction D1. In example embodiments, when the semiconductor element 250 is not activated, the light emitting layer 330 may not emit any light (e.g., a turned-off state of the OLED device 100). In this case, external light may pass through the substrate 110 in a second direction D2 (e.g., a direction from the substrate 110 into the encapsulation substrate 350) that is opposite to the first direction D1. A portion of the external light passing through the substrate 110 may be reflected as a predetermined color based on the interference phenomenon of a light in a boundary surface (e.g., a contact surface) of the first, second, and third dielectric layers 115, 150, and 190 each. In particular, the dielectric mirror structure 200 may selectively reflect a light corresponding to a wavelength generating a constructive interference or a destructive interference among the external light incident from the outside. In addition, a remaining portion of the external light passing through the substrate 110 may be reflected from the upper electrode 340 toward the first direction D1 in the first region 10. Accordingly, an image of an object that is located in the front of the OLED device 100 may be reflected as a predetermined reflection color. The upper electrode 340 may include a metal, a metal alloy, metal nitride, conductive metal oxide, and the like. For example, the upper electrode 340 may be formed of Au, Ag, Al, Pt, Ni, Ti, palladium (Pd), magnesium (Mg), Calcium (Ca), Lithium (Li), Cr, Ta, W, Cu, Mo, Sc, Nd, Iridium (Ir), an alloy of aluminum, AlNx, an alloy of silver, WNx, an alloy of copper, CrNx, an alloy of molybdenum, TiNx, TaNx, SRO, and the like. These may be used alone or in a suitable combination thereof. Alternatively, the upper electrode 340 may have a multi-layered structure.

The reflection pattern 360 may be disposed in the second region 20 on the third dielectric layer 190. For example, the reflection pattern 360 may be located in the second opening of the pixel defining layer 310. As described above, the dielectric mirror structure 200 may have a stack structure such that the high refractive index layer and the low refractive index layer are alternately stacked. For example, an external light may pass through the substrate 110 in the second direction D2. A portion of the external light passing through the substrate 110 may be reflected as a predetermined color based on the interference phenomenon of a light in a boundary surface of the first, second, and third dielectric layers 115, 150, and 190 each. In particular, the dielectric mirror structure 200 may selectively reflect a light corresponding to a wavelength generating constructive or destructive interferences among the external light incident from the outside. In addition, a remaining portion of the external light passing through the substrate 110 may be reflected from the reflection pattern 360 toward the first direction D1 in the second region 20. Accordingly, an image of an object that is located in the front of the OLED device 100 may be reflected as a predetermined reflection color. For example, the first dielectric layer 115 is formed with a thickness of about 50 Angstroms by using TiOx, and the second dielectric layer 150 is formed with a thickness of about 300 Angstroms by using SiOx. In addition, the third dielectric layer 190 is formed with a thickness of about 350 Angstroms by using TiOx. In this case, the front of the OLED device 100 may be shown as a substantially blue color. Alternatively, the first dielectric layer 115 is formed with a thickness of about 100 Angstroms by using TiOx, and the second dielectric layer 150 is formed with a thickness of about 300 Angstroms by using SiOx. In addition, the third dielectric layer 190 is formed with a thickness of about 1000 Angstroms by using TiOx. In this case, the front of the OLED device 100 may be shown as a substantially brown color. In some example embodiments, the first dielectric layer 115 is formed with a thickness of about 200 Angstroms by using TiOx, and the second dielectric layer 150 is formed with a thickness of about 400 Angstroms by using SiOx. In addition, the third dielectric layer 190 is formed with a thickness of about 100 Angstroms by using TiOx. In this case, the front of the OLED device 100 may be shown as a substantially silver color.

The reflection pattern 360 may include a metal, a metal alloy, metal nitride, conductive metal oxide, and the like. In example embodiments, the reflection pattern 360 and the upper electrode 340 may be simultaneously formed using the same material.

The encapsulation substrate 350 may be disposed on the upper electrode 340, the pixel defining layer 310, and the reflection pattern 360. The encapsulation substrate 350 and the substrate 110 may include substantially the same materials. For example, the encapsulation substrate 350 may include quartz, synthetic quartz, calcium fluoride, fluoride-doping quartz, soda lime glass, non-alkali glass, and the like. In some example embodiments, the encapsulation substrate 350 may include a transparent inorganic material or flexible plastic. For example, the encapsulation substrate 350 may include a flexible transparent resin substrate. In this case, to increase flexibility of the OLED device 100, the encapsulation substrate 350 may include a stacked structure where at least one inorganic layer and at least one organic layer are alternately stacked.

The OLED device 100 in accordance with example embodiments includes the dielectric mirror structure 200 and the reflection pattern 360. As the dielectric mirror structure 200 is disposed under the reflection pattern 360, an image of an object that is located in the front of the OLED device 100 may be reflected as a predetermined reflection color. Accordingly, the OLED device 100 may serve as a mirror OLED device—which has a predetermined reflection color—of a bottom emission structure.

FIGS. 2, 3, 4, 5, 6, and 7 are cross-sectional views illustrating a method of manufacturing an OLED device in accordance with example embodiments.

Figure 2:
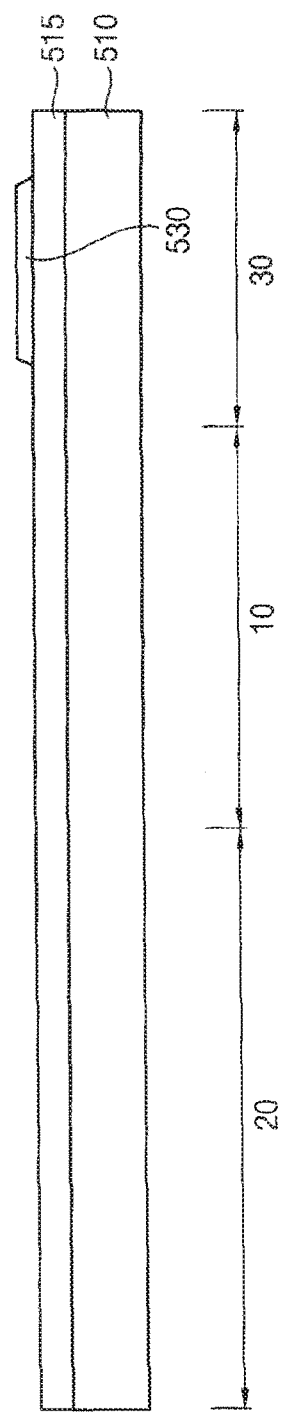
FIGS. 2, 3, 4, 5, 6, and 7 are cross-sectional views illustrating a method of manufacturing an OLED device in accordance with example embodiments.

Referring to FIG. 2, a substrate 510 having a first region 10, a second region 20, and a third region 30 may be provided. The substrate 510 may be formed using a quartz substrate, a synthetic quartz substrate, a calcium fluoride substrate, a fluoride-doping quartz substrate, a soda lime substrate, a non-alkali substrate, and the like. Alternatively, the substrate 510 may be formed of a flexible transparent material such as a flexible transparent resin substrate.

A first dielectric layer 515 may be formed on the substrate 510. The first dielectric layer 515 may be formed on the entire substrate 510. In example embodiments, the first dielectric layer 515 may have a first refractive index. For example, the first dielectric layer 515 may have the first refractive index which is determined by controlling a weight ratio of materials included in the first dielectric layer 515, or by controlling a thickness of the first dielectric layer 515. The first dielectric layer 515 may serve as a buffer layer. For example, the first dielectric layer 515 may prevent the diffusion of metal atoms and/or impurities from the substrate 510 into a semiconductor element. Additionally, the first dielectric layer 515 may control a rate of a heat transfer in a crystallization process for forming an active layer, thereby obtaining a substantially uniform active layer. Furthermore, the first dielectric layer 515 may improve a surface flatness of the substrate 510 when a surface of the substrate 510 is relatively uneven. According to a type of the substrate 510, at least two first dielectric layers 515 may be provided on the substrate 510. For example, the first dielectric layer 515 may include silicon compound, metal oxide, and the like. For example, the first dielectric layer 515 may be formed using SiOx, SiNx, SiOxNy, SiOxCy, SiCxNy, AlOx, AlNx, TaOx, HfOx, ZrOx, TiOx, and the like.

An active layer 530 may be formed in the third region 30 on the first dielectric layer 515. For example, the active layer 530 may be formed using an oxide semiconductor, an inorganic semiconductor (e.g., amorphous silicon, polysilicon, and the like), an organic semiconductor, and the like.

Figure 3:
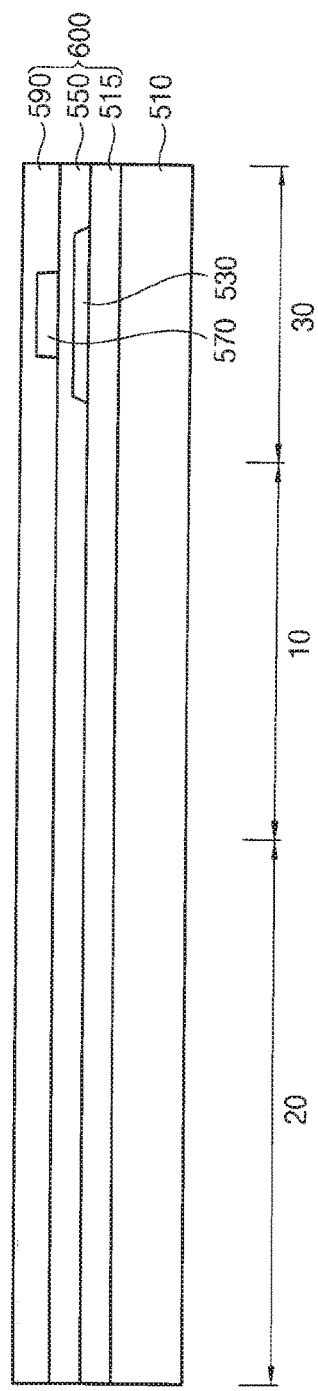

Referring to FIG. 3, a second dielectric layer 550 may be formed on the first dielectric layer 515 and the active layer 530. The second dielectric layer 550 may cover the active layer 530 in the third region 30 on the substrate 510, and may be formed on the entire substrate 510. In example embodiments, the second dielectric layer 550 may have a second refractive index that is different from the first refractive index. The second dielectric layer 550 may have the second refractive index which is determined by controlling a weight ratio of materials included in the second dielectric layer 550, or by controlling a thickness of the second dielectric layer 550. For example, the first refractive index may be a high refractive index, and the second refractive index may be a low refractive index. Alternatively, the first refractive index may be a low refractive index, and the second refractive index may be a high refractive index. The second dielectric layer 550 may serve as a gate insulation layer. For example, the second dielectric layer 550 may sufficiently cover the active layer 530, and may have a substantially even surface without a step around the active layer 530. Alternatively, the second dielectric layer 550 may cover the active layer 530, and may be formed as a substantially uniform thickness along a profile of the active layer 530. The second dielectric layer 550 may be formed using silicon compound, metal oxide, and the like.

A gate electrode 570 may be formed in the third region 30 on the second dielectric layer 550. The gate electrode 570 may be formed on a portion of the second dielectric layer 550 under which the active layer 530 is formed to overlap the active layer 530 in a planar view. The gate electrode 570 may include a metal, a metal alloy, metal nitride, conductive metal oxide, transparent conductive materials, etc. For example, the gate electrode 570 may be formed using Au, Ag, Al, an alloy of aluminum, AlNx, Ag, an alloy of silver, W, WNx, Cu, an alloy of copper, Ni, Cr, CrNx, Mo, an alloy of molybdenum, Ti, TiNx, Pt, Ta, TaNx, Nd, Sc, SRO, ZnOx, SnOx, InOx, GaOx, ITO, IZO, and the like. These may be used alone or in a suitable combination thereof. Alternatively, the gate electrode 570 may have a multi-layered structure.

A third dielectric layer 590 may be formed on the second dielectric layer 550 and the gate electrode 570. The third dielectric layer 590 may cover the gate electrode 570 in the third region 30 on the substrate 510, and may be formed on the entire substrate 510. In example embodiments, the third dielectric layer 590 may have the first refractive index. The third dielectric layer 590 may have the first refractive index which is determined by controlling a weight ratio of materials included in the third dielectric layer 590, or by controlling a thickness of the third dielectric layer 590. The third dielectric layer 590 may serve as an insulating interlayer. For example, the third dielectric layer 590 may sufficiently cover the gate electrode 570, and may have a substantially even surface without a step around the gate electrode 570. Alternatively, the third dielectric layer 590 may cover the gate electrode 570, and may be formed as a substantially uniform thickness along a profile of the gate electrode 570. The third dielectric layer 590 may be formed using silicon compound, metal oxide, etc. Accordingly, a dielectric mirror structure 600 including the first dielectric layer 515, the second dielectric layer 550, and the third dielectric layer 590 may be formed.

Figure 4:
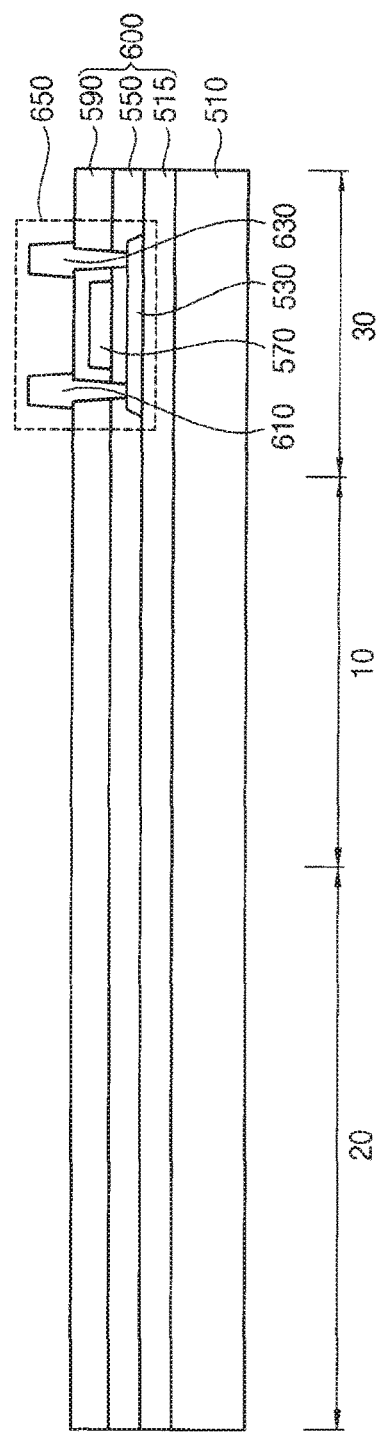

Referring to FIG. 4, a source electrode 610 and a drain electrode 630 may be formed in the third region 30 on the third dielectric layer 590. The source electrode 610 may be in contact with a first side of the active layer 530 via a contact hole formed by removing a portion of the second dielectric layer 550 and the third dielectric layer 590 each. The drain electrode 630 may be in contact with a second side of the active layer 530 via a contact hole formed by removing a portion of the second dielectric layer 550 and the third dielectric layer 590 each. Each of the source and drain electrodes 610 and 630 may be formed using a metal, a metal alloy, metal nitride, conductive metal oxide, transparent conductive materials, and the like. These may be used alone or in a suitable combination thereof. Alternatively, each of the source and drain electrodes 610 and 630 may have a multi-layered structure. Accordingly, a semiconductor element 650 including the active layer 530, the gate electrode 570, the source electrode 610, and the drain electrode 630 may be formed. In some example embodiments, the dielectric mirror structure 600 may be included in a configuration of the semiconductor element 650.

Figure 5:
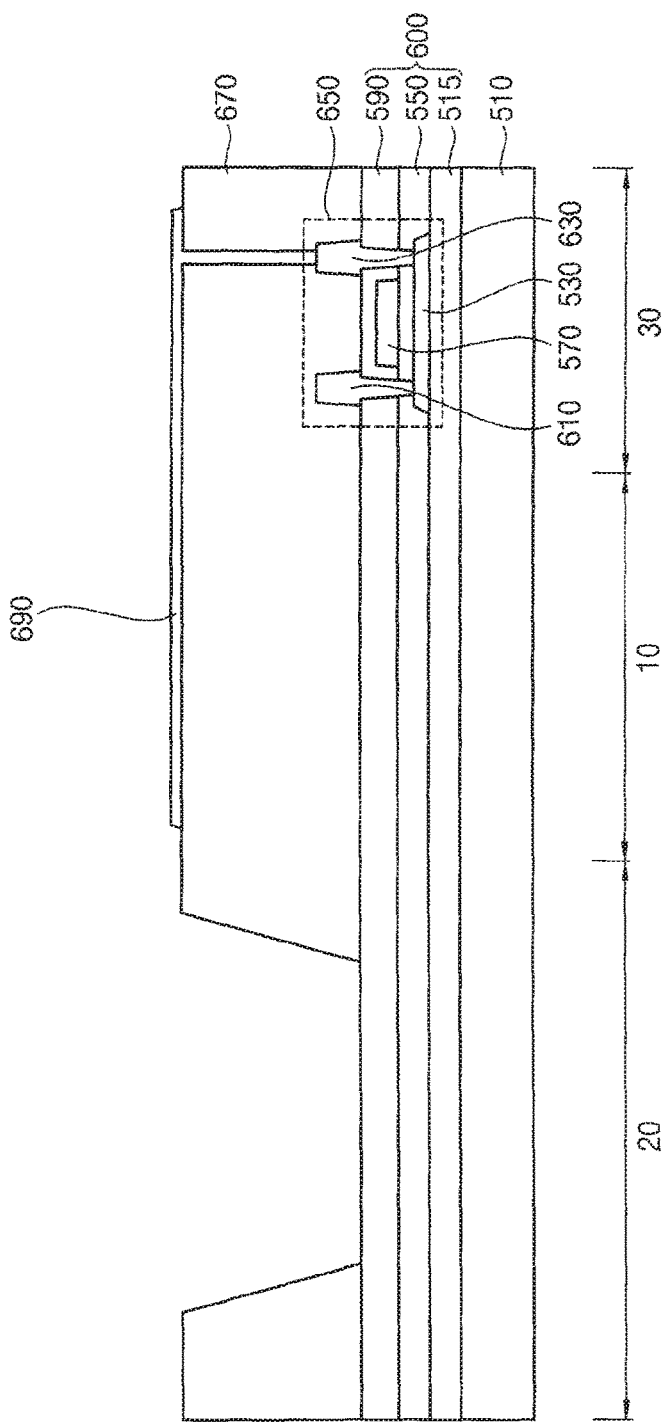

Referring to FIG. 5, a planarization layer 670 may be formed on the source and drain electrodes 610 and 630 and the third dielectric layer 590. The planarization layer 670 may have a first opening exposing the third dielectric layer 590 in the second region 20. For example, the planarization layer 670 may be formed with a relatively high thickness to sufficiently cover the source and drain electrodes 610 and 630 and the third dielectric layer 590. In this case, the planarization layer 670 may have a substantially even upper surface, and a planarization process may be further performed on the planarization layer 670 to implement the even upper surface of the planarization layer 670. The planarization layer 670 may include organic materials or inorganic materials. In example embodiments, the planarization layer 670 may include the organic materials, and may be formed using a photoresist, a polyacryl-based resin, a polyimide-based resin, a polyamide-based resin, a siloxane-based resin, an acryl-based resin, an epoxy-based resin, and the like.

A lower electrode 690 may be formed in the first region 10 and the third region 30 on the planarization layer 670. For example, a thickness of the lower electrode 690 may be less than that of an upper electrode such that light emitted from a light emitting layer is transmitted in the first direction D1. The lower electrode 690 may be in contact with the drain electrode 630 via a contact hole formed by removing a portion of the planarization layer 670. In addition, the lower electrode 690 may be electrically connected to the semiconductor element 650. The lower electrode 690 may be substantially transparent. For example, the lower electrode 690 may be formed using a metal, a metal alloy, metal nitride, conductive metal oxide, transparent conductive materials, and the like. In some example embodiments, the lower electrode 690 may have a multi-layered structure.

Figure 6:
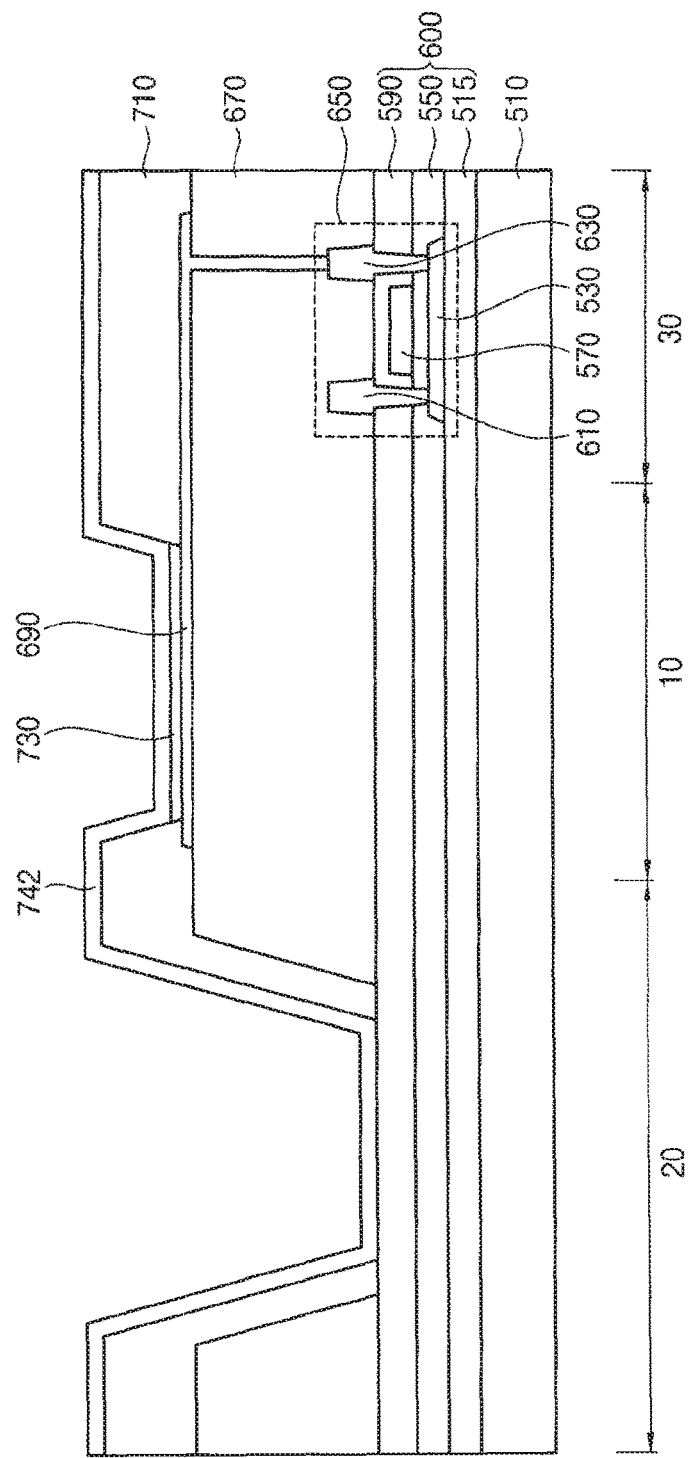

Referring to FIG. 6, a pixel defining layer 710 may be formed on a portion of the lower electrode 690, the planarization layer 670, and a portion of the third dielectric layer 590 such that the third dielectric layer 590 located in the second region 20 is exposed. For example, the pixel defining layer 710 may cover both lateral portions of the lower electrode 690. In addition, the pixel defining layer 710 may cover a side wall (e.g., a side wall of the planarization layer 670) of the first opening of the planarization layer 670, and may be formed on at least a portion of an upper surface of the third dielectric layer 590 located in the second region 20. The pixel defining layer 710 may have a second opening exposing the third dielectric layer 590 located in the second region 20 on the substrate 510. A size of the second opening may be less than that of the first opening. The light emitting layer may be located on the lower electrode 690 where at least a portion is exposed by the pixel defining layer 710. The pixel defining layer 710 may include organic materials or inorganic materials. In example embodiments, the pixel defining layer 710 may be formed using the organic materials.

A light emitting layer 730 may be formed on a portion where at least a portion of the lower electrode 690 is exposed. The light emitting layer 730 may have a multi-layered structure including EL, HIL, HTL, ETL, EIL, and the like. The HIL, the HTL, the EL, the ETL, and the EIL may be sequentially formed on the lower electrode 690. The EL of the light emitting layer 730 may be formed using at least one of light emitting materials capable of generating different colors of light (e.g., a red color of light, a blue color of light, and a green color of light, and the like). Alternatively, the EL of the light emitting layer 730 may generally generate a white color of light by stacking a plurality of light emitting materials capable of generating different colors of light such as a red color of light, a green color of light, a blue color of light, and the like. In this case, a color filter may be formed under the light emitting layer 730 (e.g., the color filter overlaps the light emitting layer 730 on the third dielectric layer 590). The color filter may include at least one selected from a red color filter, a green color filter, and a blue color filter. Alternatively, the color filter may include a yellow color filter, a cyan color filter, and a magenta color filter. The color filter may be formed using a photosensitive resin (or color photoresist), and the like.

A preliminary upper electrode 742 may be formed on a portion of the third dielectric layer 590, the pixel defining layer 710, and the light emitting layer 730. That is, preliminary upper electrode 742 may be formed on the entire substrate 510. The preliminary upper electrode 742 may include a metal, a metal alloy, metal nitride, conductive metal oxide, and the like. For example, the preliminary upper electrode 742 may be formed using Au, Ag, Al, Pt, Ni, Ti, Pd, Mg, Ca, Li, Cr, Ta, W, Cu, Mo, Sc, Nd, Ir, an alloy of aluminum, AlNx, an alloy of silver, WNx, an alloy of copper, CrNx, an alloy of molybdenum, TiNx, TaNx, SRO, and the like. These may be used alone or in a suitable combination thereof. Alternatively, the preliminary upper electrode 742 may have a multi-layered structure.

Figure 7:
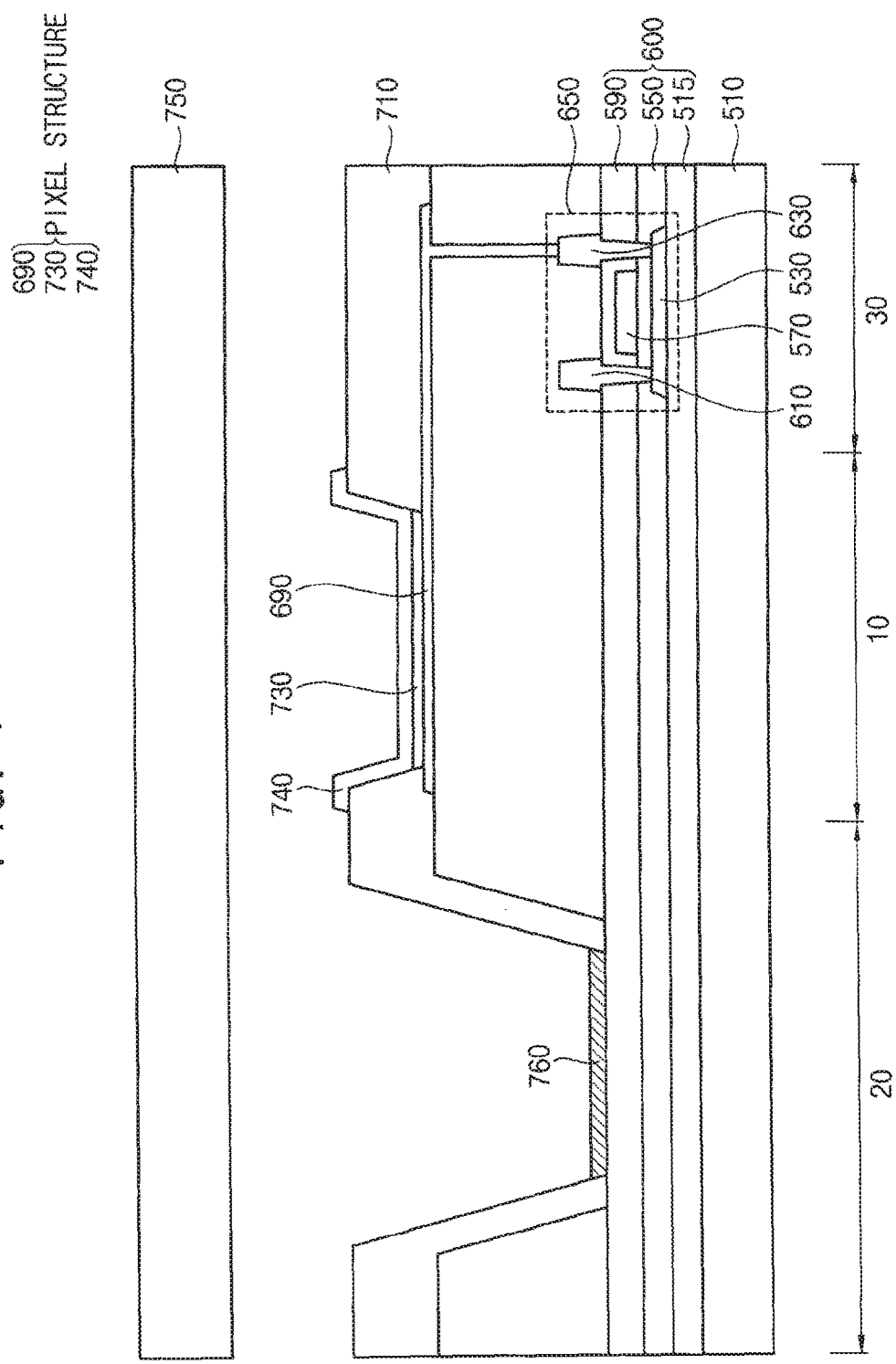

Referring to FIG. 7, an upper electrode 740 and a reflection pattern 760 may be formed by partially removing the preliminary upper electrode 742.

The upper electrode 740 may be disposed in the first region 10 on a portion of the pixel defining layer 710 and the light emitting layer 730, may expose the second region 20.

An OLED device may display a displaying image toward the first direction D1 in the first region 10 (e.g., a bottom emission structure). Thus, a thickness of the upper electrode 740 may be greater than that of the lower electrode 690 such that a light emitted from the light emitting layer 730 is reflected from the upper electrode 740 in the first direction D1. In example embodiments, when the semiconductor element 650 is not activated, the light emitting layer 730 may not emit a light (e.g., a turned-off state of the OLED device). In this case, an external light may pass through the substrate 510 in a second direction D2 that is opposite to the first direction D1. A portion of the external light passing through the substrate 510 may be reflected as a predetermined color based on the interference phenomenon of a light in a boundary surface of the first, second, and third dielectric layers 515, 550, and 590 each. In particular, the dielectric mirror structure 600 may selectively reflect a light corresponding to a wavelength generating a constructive interference or a destructive interference among the external light incident from the outside. In addition, a remaining portion of the external light passing through the substrate 510 may be reflected from the upper electrode 740 toward the first direction D1 in the first region 10. Accordingly, an image of an object that is located in the front of the OLED device may be reflected as a predetermined reflection color.

The reflection pattern 760 may be formed in the second region 20 on the third dielectric layer 590. For example, the reflection pattern 760 may be located in the second opening of the pixel defining layer 710. As described above, the dielectric mirror structure 600 may have a stack structure such that the high refractive index layer and the low refractive index layer are alternately stacked. For example, an external light may pass through the substrate 510 in the second direction D2. A portion of the external light passing through the substrate 510 may be reflected as a predetermined color based on the interference phenomenon of a light in a boundary surface of the first, second, and third dielectric layers 515, 550, and 590 each. In particular, the dielectric mirror structure 600 may selectively reflect light corresponding to a wavelength generating constructive or destructive interference with the external light incident from the outside. In addition, a remaining portion of the external light passing through the substrate 510 may be reflected from the reflection pattern 760 toward the first direction D1 in the second region 20. Accordingly, an image of an object that is located in the front of the OLED device may be reflected as a predetermined reflection color. For example, the first dielectric layer 515 is formed with a thickness of about 50 Angstroms by using TiOx, and the second dielectric layer 550 is formed with a thickness of about 300 Angstroms by using SiOx. In addition, the third dielectric layer 590 is formed with a thickness of about 350 Angstroms by using TiOx. In this case, the front of the OLED device may be shown as a substantially blue color. Alternatively, the first dielectric layer 515 is formed with a thickness of about 100 Angstroms by using TiOx, and the second dielectric layer 550 is formed with a thickness of about 300 Angstroms by using SiOx. In addition, the third dielectric layer 590 is formed with a thickness of about 1000 Angstroms by using TiOx. In this case, the front of the OLED device may be shown as a substantially brown color. In some example embodiments, the first dielectric layer 515 is formed with a thickness of about 200 Angstroms by using TiOx, and the second dielectric layer 550 is formed with a thickness of about 400 Angstroms by using SiOx. In addition, the third dielectric layer 590 is formed with a thickness of about 100 Angstroms by using TiOx. In this case, the front of the OLED device may be shown as a substantially silver color.

An encapsulation substrate 750 may be formed on the upper electrode 740, the pixel defining layer 710, and the reflection pattern 760. The encapsulation substrate 750 and the substrate 510 may include substantially the same materials. For example, the encapsulation substrate 750 may be formed using quartz, synthetic quartz, calcium fluoride, fluoride-doping quartz, soda lime glass, non-alkali glass, and the like. In some example embodiments, the encapsulation substrate 750 may include a transparent inorganic material or flexible plastic. For example, the encapsulation substrate 750 may include a flexible transparent resin substrate. In this case, to increase flexibility of the OLED device, the encapsulation substrate 750 may include a stacked structure where at least one inorganic layer and at least one organic layer are alternately stacked. Accordingly, the OLED device illustrated in FIG. 1 may be manufactured.

Figure 8:
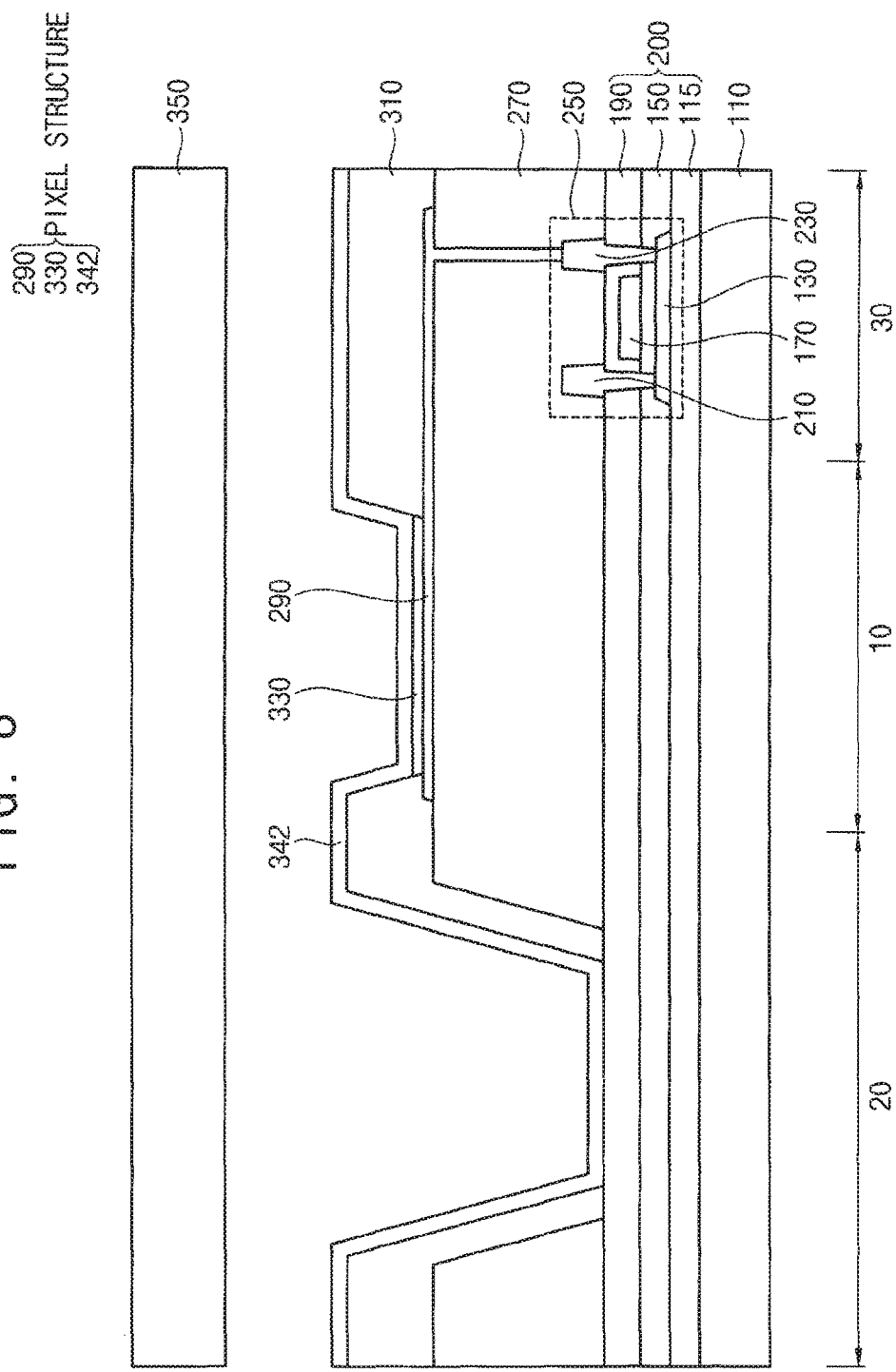
FIG. 8 is a cross-sectional view illustrating an OLED device in accordance with example embodiments.

FIG. 8 is a cross-sectional view illustrating an OLED device in accordance with example embodiments. An OLED device illustrated in FIG. 8 may have a configuration substantially the same as or similar to that of an OLED device 100 described with reference to FIG. 1 except an upper electrode 342. In FIG. 8, detailed descriptions for elements that are substantially the same as or similar to elements described with reference to FIG. 1 may not be repeated.

Referring to FIGS. 1 and 8, an OLED device may include a substrate 110, a dielectric mirror structure 200, a semiconductor element 250, a planarization layer 270, a pixel structure, a pixel defining layer 310, an encapsulation substrate 350, etc. Here, the semiconductor element 250 may include an active layer 130, a gate electrode 170, a source electrode 210, and a drain electrode 230, and the pixel structure may include a lower electrode 290, a light emitting layer 330, and an upper electrode 342. In addition, the dielectric mirror structure 200 may include a first dielectric layer 115, a second dielectric layer 150, and a third dielectric layer 190.

The upper electrode 342 may be disposed on a portion of the third dielectric layer 190, the pixel defining layer 310, and the light emitting layer 330. That is, the upper electrode 342 may be disposed on the entire substrate 110. As the upper electrode 342 is disposed in the second region 20, the upper electrode 342 may serve as a reflection pattern. Accordingly, since the OLED device does not further include any other reflection pattern, a manufacturing cost of the OLED device may be reduced. In addition, as a size of the upper electrode 342 is relatively increased, an IR-drop phenomenon capable of being generated in the OLED device may be decreased.

Figure 9:
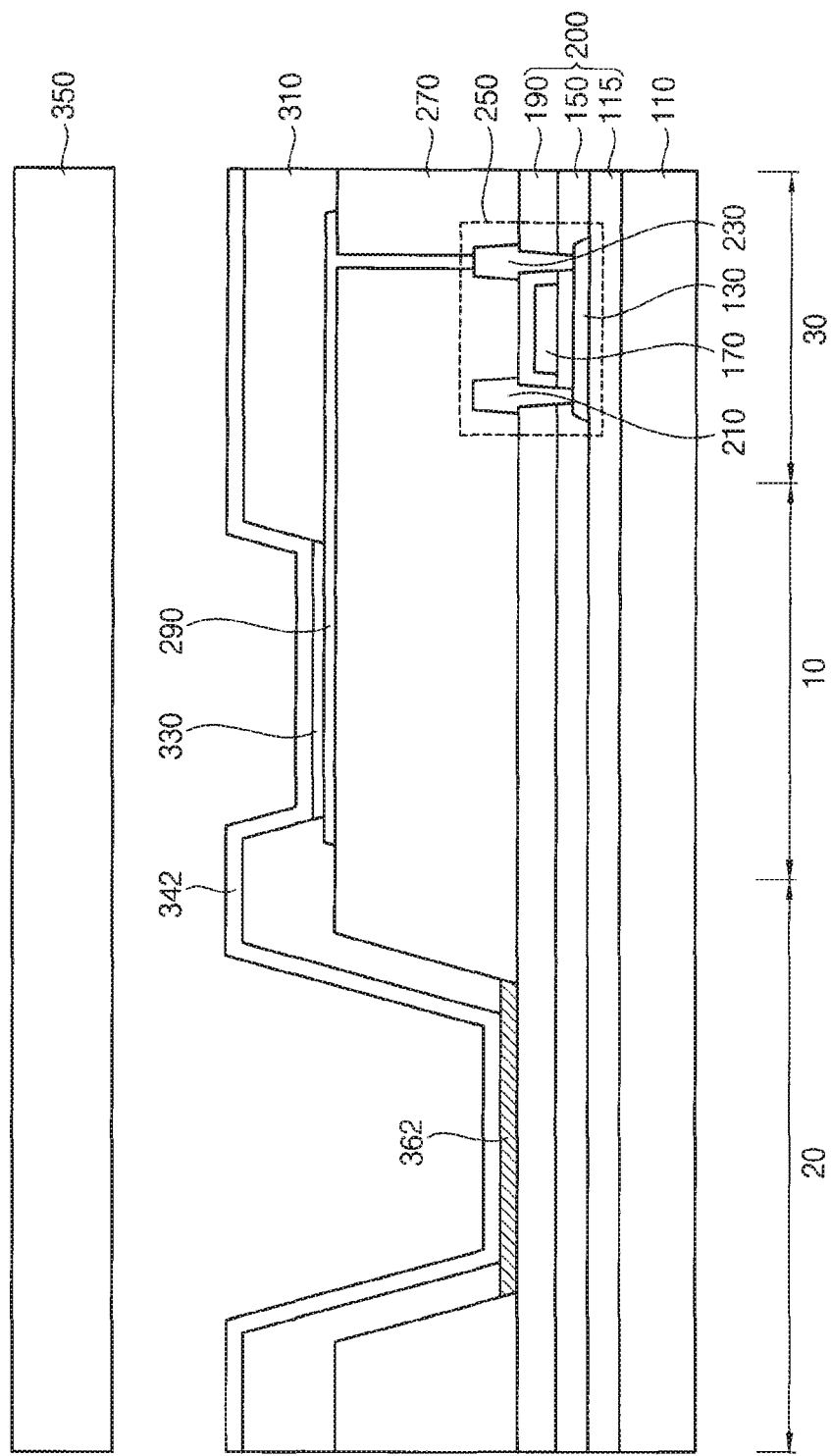
FIG. 9 is a cross-sectional view illustrating an OLED device in accordance with example embodiments.

FIG. 9 is a cross-sectional view illustrating an OLED device in accordance with example embodiments. An OLED device illustrated in FIG. 9 may have a configuration substantially the same as or similar to that of an OLED device 100 described with reference to FIG. 1 except an upper electrode 342 and a reflection pattern 362. In FIG. 9, detailed descriptions for elements that are substantially the same as or similar to elements described with reference to FIG. 1 may not be repeated.

Referring to FIGS. 1 and 9, an OLED device may include a substrate 110, a dielectric mirror structure 200, a semiconductor element 250, a planarization layer 270, a pixel structure, a pixel defining layer 310, a reflection pattern 362, an encapsulation substrate 350, etc. Here, the semiconductor element 250 may include an active layer 130, a gate electrode 170, a source electrode 210, and a drain electrode 230, and the pixel structure may include a lower electrode 290, a light emitting layer 330, and an upper electrode 342. In addition, the dielectric mirror structure 200 may include a first dielectric layer 115, a second dielectric layer 150, and a third dielectric layer 190.

The reflection pattern 362 may be disposed in the second region 20 on the third dielectric layer 190. For example, the reflection pattern 362 may be located in a first opening of the planarization layer 270. In example embodiments, the reflection pattern 362 and the lower electrode 290 may be simultaneously formed and may be formed using the same materials.

The pixel defining layer 310 may be disposed on a portion of the lower electrode 290, the planarization layer 270, and a portion of the reflection pattern 362 such that the second region 20 is exposed. For example, the pixel defining layer 310 may cover both lateral portions of the lower electrode 290. In addition, the pixel defining layer 310 may cover a side wall (e.g., a side wall of the planarization layer 270) of the first opening of the planarization layer 270, and may be disposed on at least a portion of an upper surface of the reflection pattern 362 located in the second region 20. That is, the pixel defining layer 310 may not be in direct contact with the third dielectric layer 190. The pixel defining layer 310 may have a second opening exposing the reflection pattern 362 located in the second region 20 on the substrate 110. A size of the second opening may be less than that of the first opening. The pixel defining layer 310 may include organic materials or inorganic materials. In example embodiments, the pixel defining layer 310 may include the organic materials.

The upper electrode 342 may be disposed on the reflection pattern 362, the pixel defining layer 310, and the light emitting layer 330. That is, the upper electrode 342 may be disposed on the entire substrate 110. As the upper electrode 342 is disposed in the second region 20, the upper electrode 342 together with the reflection pattern 362 may reflect an external light. In addition, as the upper electrode 342 is in contact with the reflection pattern 362, a size of the upper electrode 342 is relatively increased, and thus an IR-drop phenomenon capable of being generated in the OLED device may be further decreased.

Figure 10:
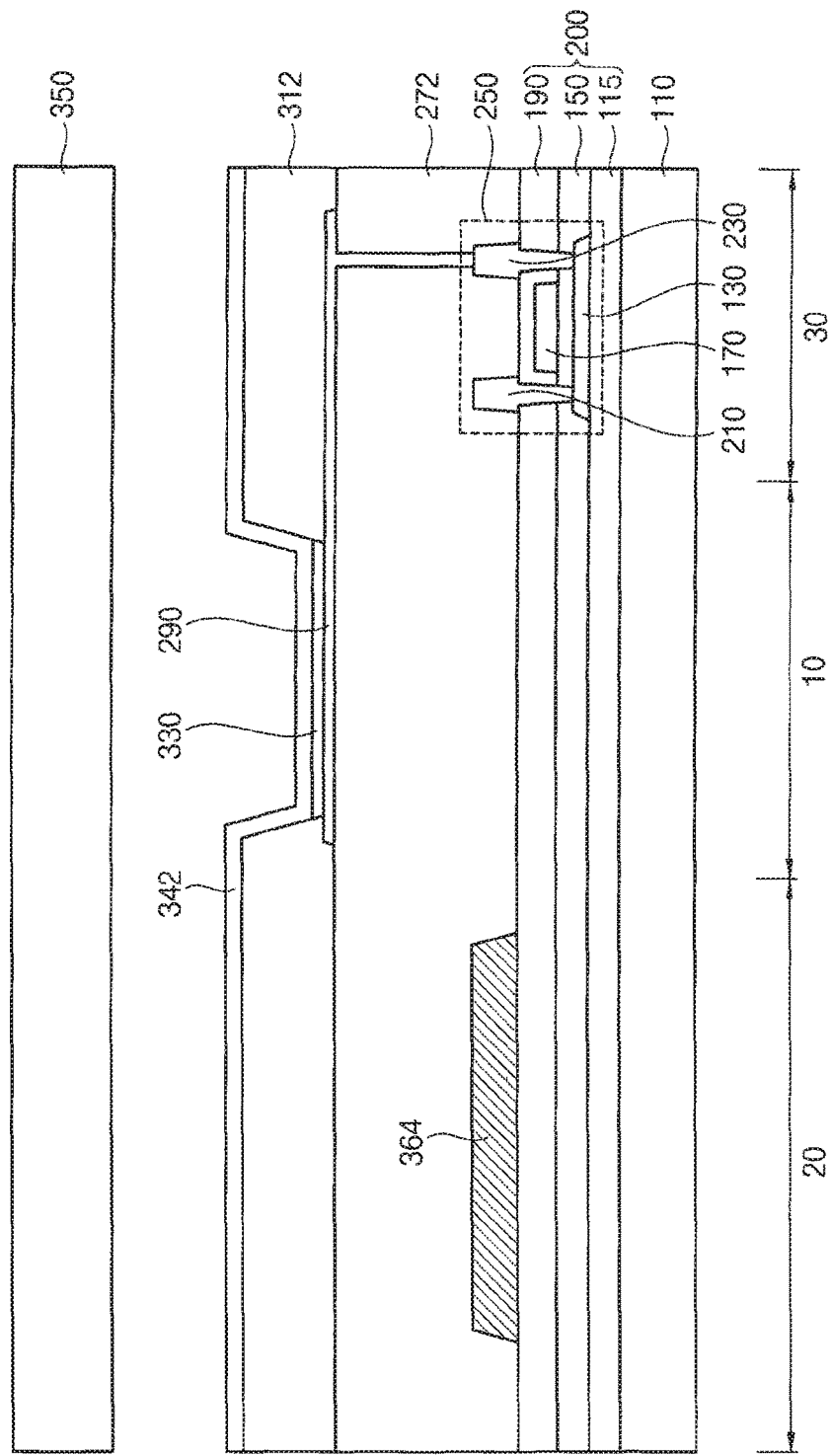
FIG. 10 is a cross-sectional view illustrating an OLED device in accordance with example embodiments.

FIG. 10 is a cross-sectional view illustrating an OLED device in accordance with example embodiments. An OLED device illustrated in FIG. 10 may have a configuration substantially the same as or similar to that of an OLED device 100 described with reference to FIG. 1 except a planarization layer 272, a pixel defining layer 312, an upper electrode 342, and a reflection pattern 364. In FIG. 10, detailed descriptions for elements that are substantially the same as or similar to elements described with reference to FIG. 1 may not be repeated.

Referring to FIGS. 1 and 10, an OLED device may include a substrate 110, a dielectric mirror structure 200, a semiconductor element 250, a planarization layer 272, a pixel structure, a pixel defining layer 312, a reflection pattern 364, an encapsulation substrate 350, etc. Here, the semiconductor element 250 may include an active layer 130, a gate electrode 170, a source electrode 210, and a drain electrode 230, and the pixel structure may include a lower electrode 290, a light emitting layer 330, and an upper electrode 342. In addition, the dielectric mirror structure 200 may include a first dielectric layer 115, a second dielectric layer 150, and a third dielectric layer 190.

The reflection pattern 364 may be disposed in the second region 20 on the third dielectric layer 190. For example, the reflection pattern 364, the source electrode 210, and the drain electrode 230 may be located at the same level, and may be simultaneously formed using the same materials.

The planarization layer 272 may be disposed on the reflection pattern 364, the source and drain electrodes 210 and 230, and the third dielectric layer 190. That is, the planarization layer 272 may be disposed on the entire substrate 110. For example, the planarization layer 272 may be disposed with a relatively high thickness to sufficiently cover the reflection pattern 364, the source and drain electrodes 210 and 230, and the third dielectric layer 190. In this case, the planarization layer 272 may have a substantially even upper surface, and a planarization process may be further performed on the planarization layer 272 to implement the even upper surface of the planarization layer 272. The planarization layer 272 may include organic materials or inorganic materials. In example embodiments, the planarization layer 272 may include the organic materials.

The pixel defining layer 312 may be disposed on a portion of the lower electrode 290 and the planarization layer 272. For example, the pixel defining layer 312 may cover both lateral portions of the lower electrode 290, and may be disposed on the entire planarization layer 272. The pixel defining layer 312 may include organic materials or inorganic materials. In example embodiments, the pixel defining layer 312 may include the organic materials.

The upper electrode 342 may be disposed on the pixel defining layer 312 and the light emitting layer 330. That is, the upper electrode 342 may be disposed on the entire substrate 110. In example embodiments, when the semiconductor element 250 is not activated, the light emitting layer 330 may not emit a light (e.g., a turned-off state of the OLED device 100). In this case, an external light may pass through the substrate 110 in a second direction D2 (e.g., a direction from the substrate 110 into the encapsulation substrate 350) that is opposite to the first direction D1. A portion of the external light passing through the substrate 110 may be reflected as a predetermined color based on the interference phenomenon of a light in a boundary surface of the first, second, and third dielectric layers 115, 150, and 190 each. In particular, the dielectric mirror structure 200 may selectively reflect a light corresponding to a wavelength generating a constructive interference or a destructive interference among the external light incident from the outside. In addition, a remaining portion of the external light passing through the substrate 110 may be reflected from the upper electrode 342 toward the first direction D1 in the first region 10. Accordingly, an image of an object that is located in the front of the OLED device 100 may be reflected as a predetermined reflection color.

Figure 11:
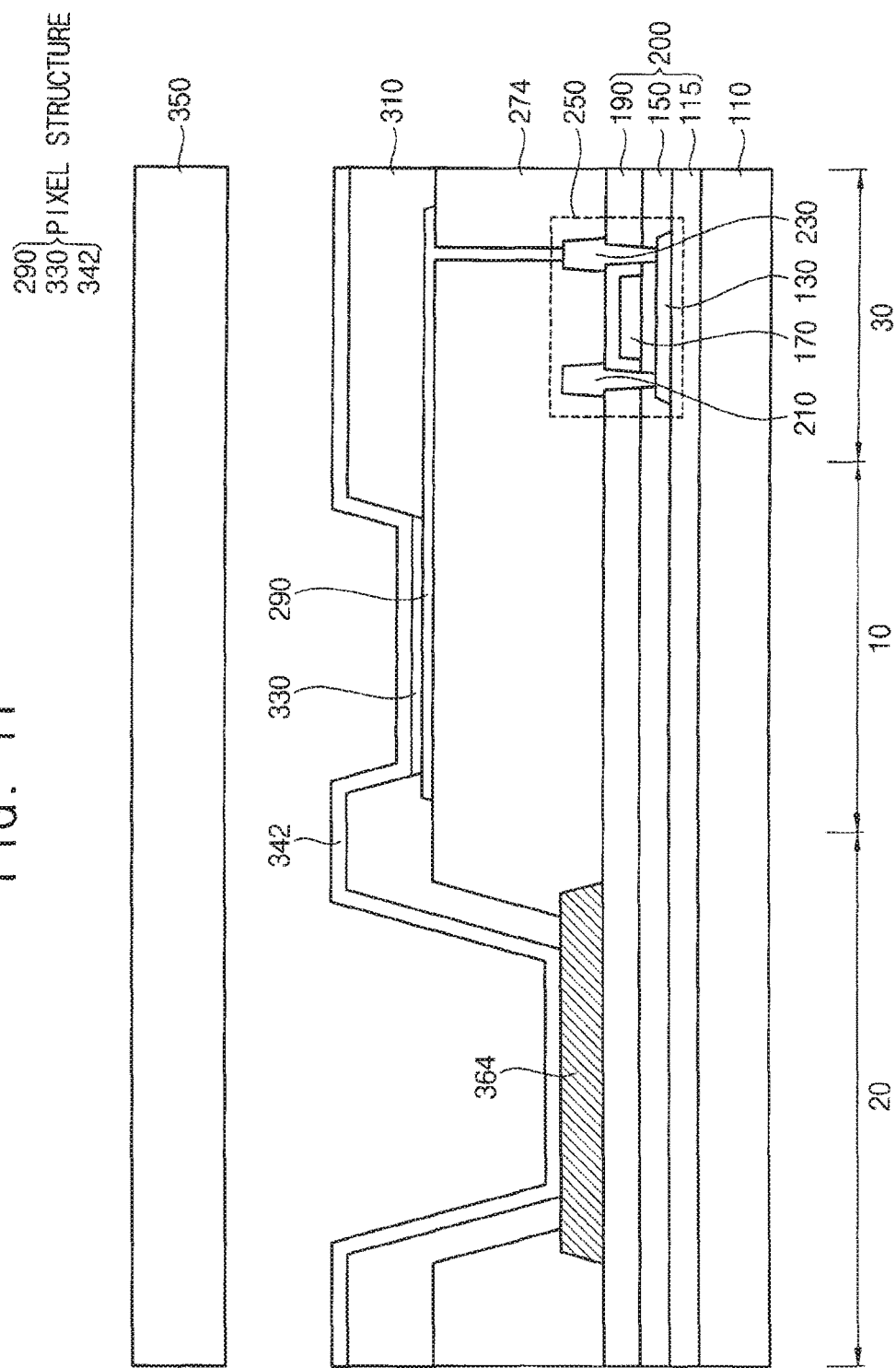
FIG. 11 is a cross-sectional view illustrating an OLED device in accordance with example embodiments.

FIG. 11 is a cross-sectional view illustrating an OLED device in accordance with example embodiments. An OLED device illustrated in FIG. 11 may have a configuration substantially the same as or similar to that of an OLED device 100 described with reference to FIG. 1 except an upper electrode 342 and a reflection pattern 364. In FIG. 11, detailed descriptions for elements that are substantially the same as or similar to elements described with reference to FIG. 1 may not be repeated.

Referring to FIGS. 1 and 11, an OLED device may include a substrate 110, a dielectric mirror structure 200, a semiconductor element 250, a planarization layer 274, a pixel structure, a pixel defining layer 310, a reflection pattern 364, an encapsulation substrate 350, etc. Here, the semiconductor element 250 may include an active layer 130, a gate electrode 170, a source electrode 210, and a drain electrode 230, and the pixel structure may include a lower electrode 290, a light emitting layer 330, and an upper electrode 342. In addition, the dielectric mirror structure 200 may include a first dielectric layer 115, a second dielectric layer 150, and a third dielectric layer 190.

The reflection pattern 364 may be disposed in the second region 20 on the third dielectric layer 190. For example, the reflection pattern 364, the source electrode 210, and the drain electrode 230 may be located at the same level, and may be simultaneously formed using the same materials.

The planarization layer 274 may be disposed on a portion of the reflection pattern 364, the source and drain electrodes 210 and 230 and the third dielectric layer 190. The planarization layer 274 may have a first opening exposing the reflection pattern 364 in the second region 20. For example, the planarization layer 274 may be disposed with a relatively high thickness to sufficiently cover the source and drain electrodes 210 and 230 and the third dielectric layer 190, and cover both lateral portions of the reflection pattern 364. In this case, the planarization layer 274 may have a substantially even upper surface, and a planarization process may be further performed on the planarization layer 274 to implement the even upper surface of the planarization layer 274. The planarization layer 274 may include organic materials or inorganic materials. In example embodiments, the planarization layer 274 may include the organic materials.

The pixel defining layer 310 may be disposed on a portion of the lower electrode 290, the planarization layer 274, and a portion of the reflection pattern 364 such that at least a portion of the second region 20 is exposed. For example, the pixel defining layer 310 may cover two lateral portions of the lower electrode 290. In addition, the pixel defining layer 310 may cover a side wall of the first opening of the planarization layer 274, and may be disposed on at least a portion of an upper surface of the reflection pattern 364 located in the second region 20. That is, the pixel defining layer 310 may not be in direct contact with the third dielectric layer 190. The pixel defining layer 310 may have a second opening exposing at least a portion of the reflection pattern 364 located in the second region 20 on the substrate 110. A size of the second opening may be less than that of the first opening. The pixel defining layer 310 may include organic materials or inorganic materials. In example embodiments, the pixel defining layer 310 may include the organic materials.

The upper electrode 342 may be disposed on the reflection pattern 364, the pixel defining layer 310, and the light emitting layer 330. That is, the upper electrode 342 may be disposed on the entire substrate 110. As the upper electrode 342 is disposed in the second region 20, the upper electrode 342 may be in contact with the reflection pattern 362, and thus a resistance of the upper electrode 342 is relatively decreased. Accordingly, an IR-drop phenomenon capable of being generated in the OLED device may be further decreased.

Figure 12:
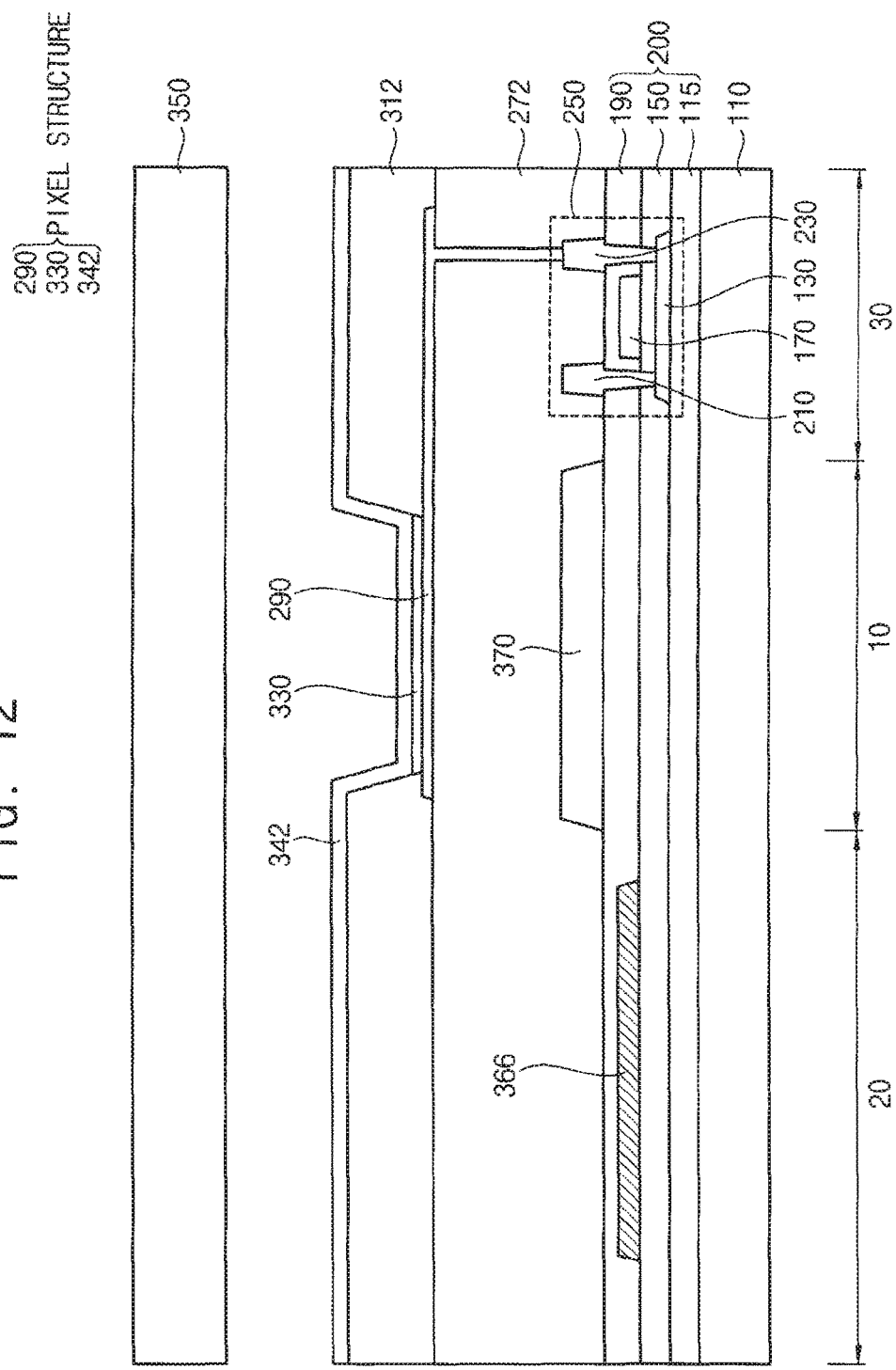
FIG. 12 is a cross-sectional view illustrating an OLED device in accordance with example embodiments.

FIG. 12 is a cross-sectional view illustrating an OLED device in accordance with example embodiments. An OLED device illustrated in FIG. 12 may have a configuration substantially the same as or similar to that of an OLED device 100 described with reference to FIG. 1 except a planarization layer 272, a pixel defining layer 312, an upper electrode 342, a reflection pattern 366, and a color filter 370. In FIG. 12, detailed descriptions for elements that are substantially the same as or similar to elements described with reference to FIG. 1 may not be repeated.

Referring to FIGS. 1 and 12, an OLED device may include a substrate 110, a dielectric mirror structure 200, a semiconductor element 250, a planarization layer 272, a pixel structure, a pixel defining layer 312, a reflection pattern 366, a color filter 370, an encapsulation substrate 350, etc. Here, the semiconductor element 250 may include an active layer 130, a gate electrode 170, a source electrode 210, and a drain electrode 230, and the pixel structure may include a lower electrode 290, a light emitting layer 330, and an upper electrode 342. In addition, the dielectric mirror structure 200 may include a first dielectric layer 115, a second dielectric layer 150, and a third dielectric layer 190.

The reflection pattern 366 may be disposed in the second region 20 on the second dielectric layer 150. For example, the reflection pattern 366 and the gate electrode 170 may be located at the same level (e.g. both located directly on the substantially even upper surface of the second dielectric layer 150), and may be simultaneously formed using the same materials.

The color filter 370 may be disposed in the first region 10 on the third dielectric layer 190. That is, the color filter 370 may overlap the light emitting layer 330. As the dielectric mirror structure 200 is disposed under the color filter 370, the light may pass through the substrate 110 in the first direction D1 after a light passing through the color filter 370 controls a color of the light by the dielectric mirror structure 200. The color filter 370 may include at least one selected from a red color filter, a green color filter, and a blue color filter. Alternatively, the color filter 370 may include a yellow color filter, a cyan color filter, and a magenta color filter. The color filter 370 may be formed of a photosensitive resin (or color photoresist) or the like.

The planarization layer 272 may be disposed on the source and drain electrodes 210 and 230, the color filter 370, and the third dielectric layer 190. That is, the planarization layer 272 may be disposed on the entire substrate 110. For example, the planarization layer 272 may be disposed with a relatively high thickness to sufficiently cover the source and drain electrodes 210 and 230, the color filter 370, and the third dielectric layer 190. In this case, the planarization layer 272 may have a substantially even upper surface, and a planarization process may be further performed on the planarization layer 272 to implement the even upper surface of the planarization layer 272. The planarization layer 272 may include organic materials or inorganic materials. In example embodiments, the planarization layer 272 may include the organic materials.

The pixel defining layer 312 may be disposed on a portion of the lower electrode 290 and the planarization layer 272. For example, the pixel defining layer 312 may cover both lateral portions of the lower electrode 290, and may be disposed on the entire planarization layer 272. The pixel defining layer 312 may include organic materials or inorganic materials. In example embodiments, the pixel defining layer 312 may include the organic materials.

The upper electrode 342 may be disposed on the pixel defining layer 312 and the light emitting layer 330. That is, the upper electrode 342 may be disposed on the entire substrate 110.

Figure 13:
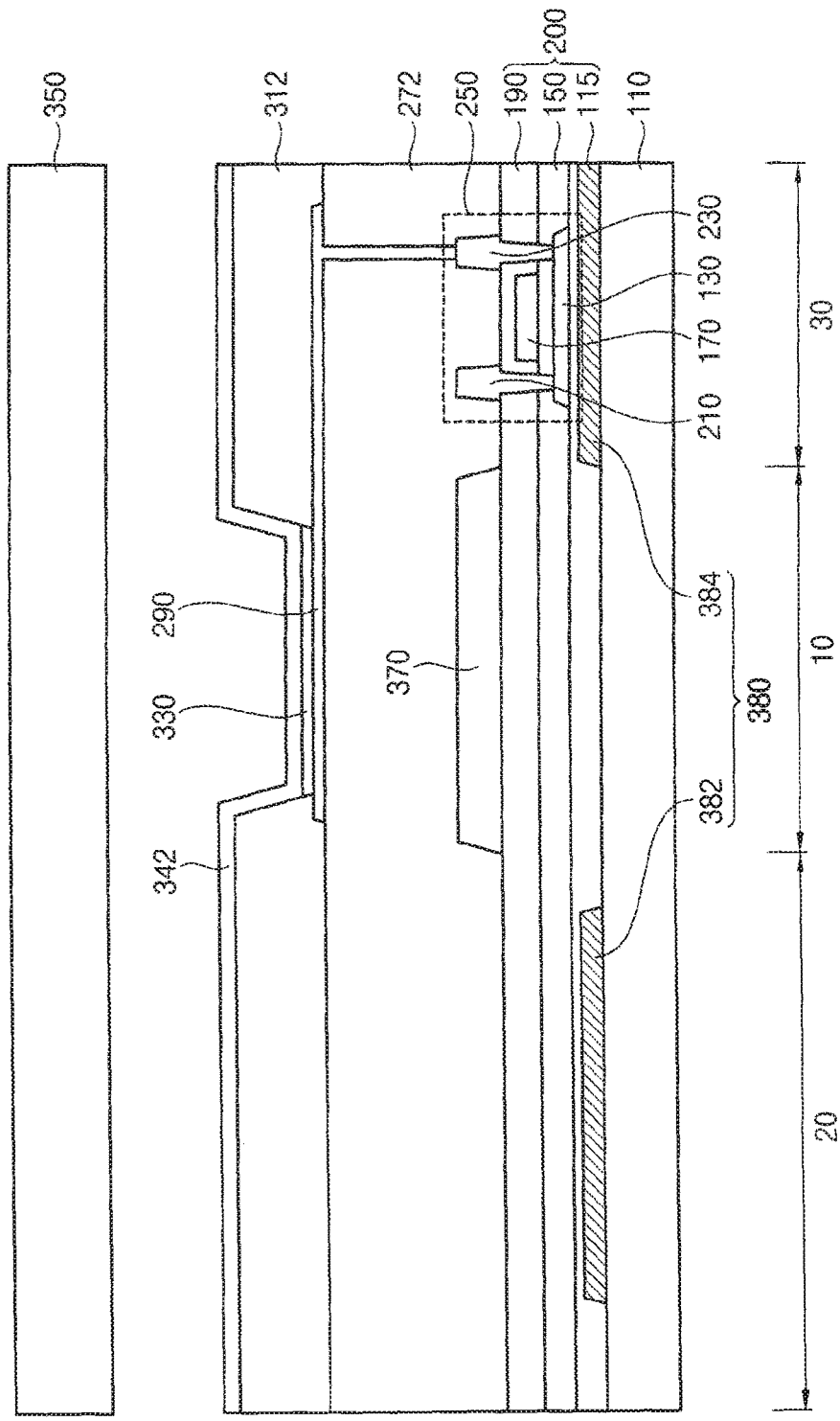
FIG. 13 is a cross-sectional view illustrating an OLED device in accordance with example embodiments.
Figure 14:
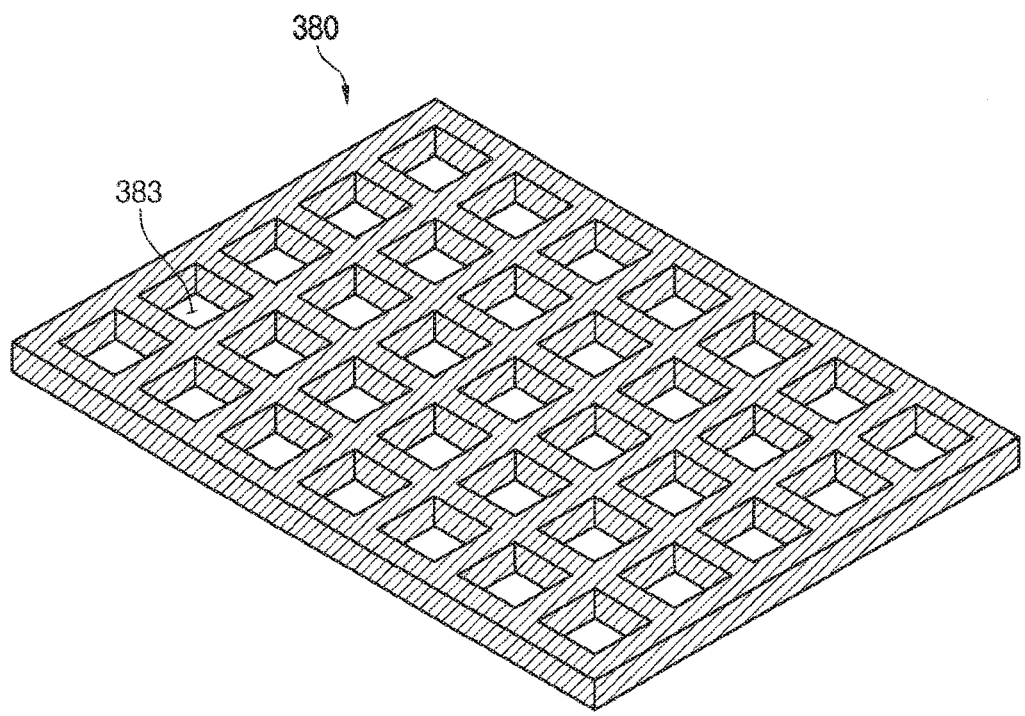
FIG. 14 is a perspective view for describing a reflection pattern included in the OLED device of FIG. 13.
Figure 15:
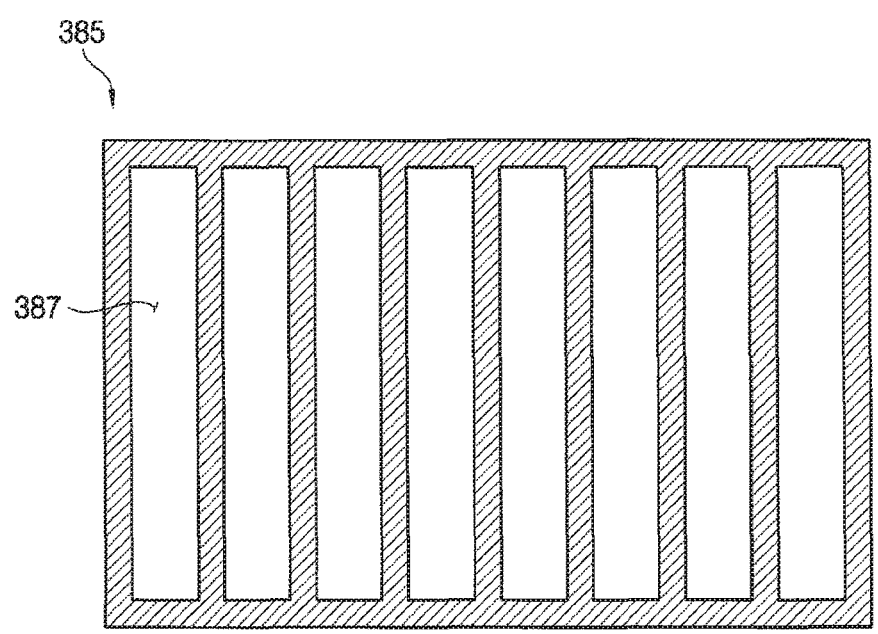
FIG. 15 is a planar view illustrating an example of a reflection pattern included in the OLED device of FIG. 13.

FIG. 13 is a cross-sectional view illustrating an OLED device in accordance with example embodiments, and FIG. 14 is a perspective view for describing a reflection pattern included in the OLED device of FIG. 13. FIG. 15 is a planar view illustrating an example of a reflection pattern included in the OLED device of FIG. 13. An OLED device illustrated in FIG. 13 may have a configuration substantially the same as or similar to that of an OLED device 100 described with reference to FIG. 1 except a planarization layer 272, a pixel defining layer 312, an upper electrode 342, a reflection pattern 380, and a color filter 370. In FIG. 13, detailed descriptions for elements that are substantially the same as or similar to elements described with reference to FIG. 1 may not be repeated.

Referring to FIGS. 1, 13, 14, and 15 an OLED device may include a substrate 110, a dielectric mirror structure 200, a semiconductor element 250, a planarization layer 272, a pixel structure, a pixel defining layer 312, a reflection pattern 380, a color filter 370, an encapsulation substrate 350, etc. Here, the semiconductor element 250 may include an active layer 130, a gate electrode 170, a source electrode 210, and a drain electrode 230, and the pixel structure may include a lower electrode 290, a light emitting layer 330, and an upper electrode 342. In addition, the dielectric mirror structure 200 may include a first dielectric layer 115, a second dielectric layer 150, and a third dielectric layer 190. Further, the reflection pattern 380 may include a first reflection pattern 382 and a second reflection pattern 384.

The first reflection pattern 382 may be disposed between the substrate 110 and the first dielectric layer 115 in the second region 20, and the second reflection pattern 384 may be disposed between the substrate 110 and the first dielectric layer 115 in the third region 30. As the second reflection pattern 384 may be disposed under the semiconductor element 250, the OLED device may prevent an external light from being reflected from the semiconductor element 250. In addition, as a size of the reflection pattern 380 may be varied to become larger, a reflectivity of the OLED device may increase.

In example embodiments, as illustrated in FIG. 14, the first reflection pattern 382 and the second reflection pattern 384 may be integrally formed, and the reflection pattern 380 may have a mesh structure having an opening 383 exposing the first region 10. In some example embodiments, as illustrated in FIG. 15, the first reflection pattern 382 and the second reflection pattern 384 may be spaced apart from each other, and may have a planar shape of a bar. That is, the reflection pattern 385 may have a slit shape including an opening 387 of a bar shape.

The color filter 370 may be disposed in the first region 10 on the third dielectric layer 190. That is, the light emitting layer 330 may overlap the color filter 370. As the dielectric mirror structure 200 is disposed under the color filter 370, the light may pass through the substrate 110 in the first direction D1 after a light passing through the color filter 370 controls a color of the light by the dielectric mirror structure 200. The color filter 370 may include at least one selected from a red color filter, a green color filter, and a blue color filter. Alternatively, the color filter 370 may include at least one selected from a yellow color filter, a cyan color filter, and a magenta color filter. The color filter 370 may be formed of a photosensitive resin (or color photoresist), or the like.

The planarization layer 272 may be disposed on the source and drain electrodes 210 and 230, the color filter 370, and the third dielectric layer 190. That is, the planarization layer 272 may be disposed on the entire substrate 110. For example, the planarization layer 272 may be disposed as a relatively high thickness to sufficiently cover the source and drain electrodes 210 and 230, the color filter 370, and the third dielectric layer 190. In this case, the planarization layer 272 may have a substantially even upper surface, and a planarization process may be further performed on the planarization layer 272 to implement the even upper surface of the planarization layer 272. The planarization layer 272 may include organic materials or inorganic materials. In example embodiments, the planarization layer 272 may include the organic materials.

The pixel defining layer 312 may be disposed on a portion of the lower electrode 290 and the planarization layer 272. For example, the pixel defining layer 312 may cover both lateral portions of the lower electrode 290, and may be disposed on the entire planarization layer 272. The pixel defining layer 312 may include organic materials or inorganic materials. In example embodiments, the pixel defining layer 312 may include the organic materials.

The upper electrode 342 may be disposed on the pixel defining layer 312 and the light emitting layer 330. That is, the upper electrode 342 may be disposed on the entire substrate 110.

Figure 16:
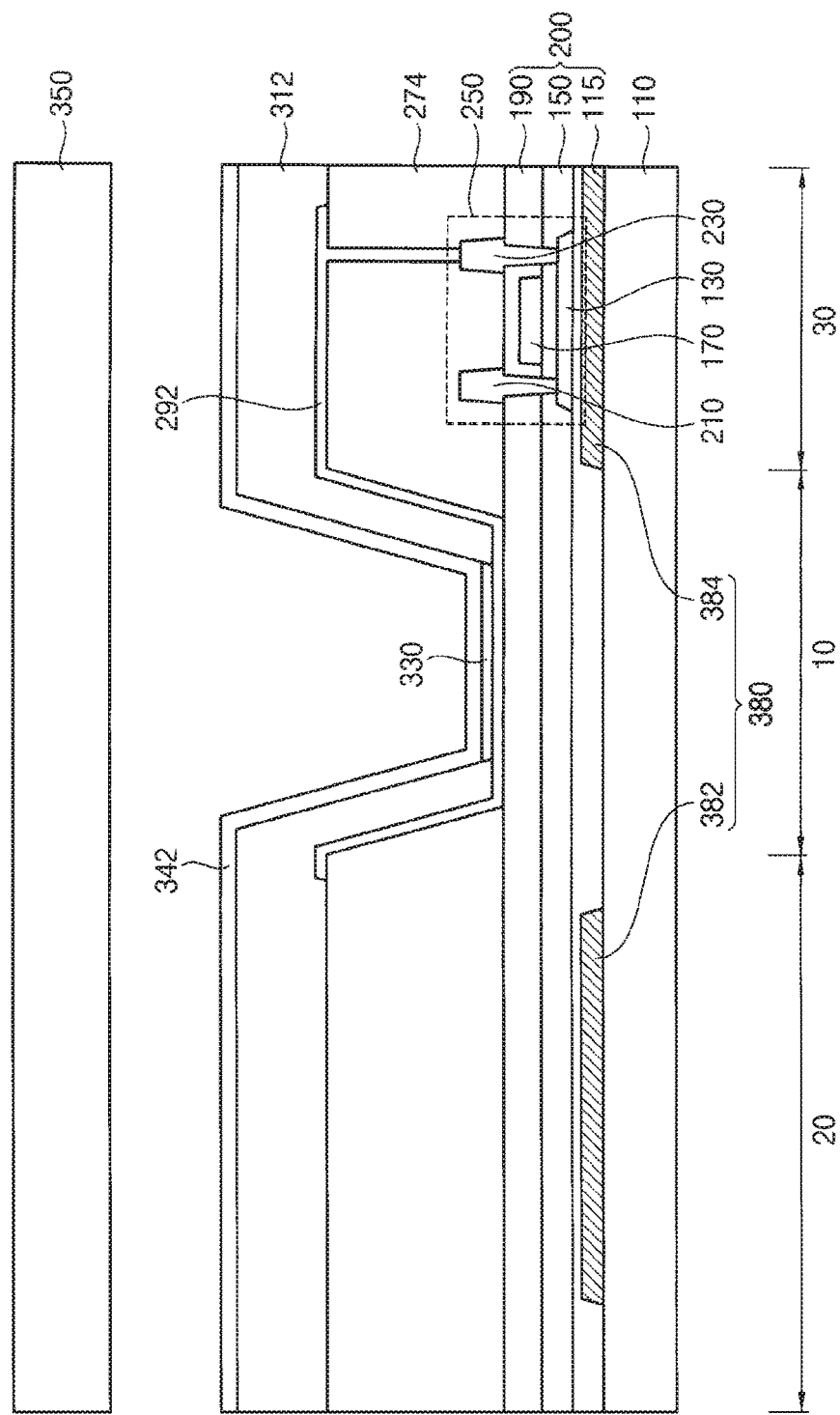
FIG. 16 is a cross-sectional view illustrating an OLED device in accordance with example embodiments.

FIG. 16 is a cross-sectional view illustrating an OLED device in accordance with example embodiments. An OLED device illustrated in FIG. 16 may have a configuration substantially the same as or similar to that of OLED devices described with reference to FIGS. 1 and 14 except a planarization layer 274 and a lower electrode 292. In FIG. 16, detailed descriptions for elements that are substantially the same as or similar to elements described with reference to FIGS. 1 and 14 may not be repeated.

Referring to FIGS. 1, 14 and 16, an OLED device may include a substrate 110, a dielectric mirror structure 200, a semiconductor element 250, a planarization layer 274, a pixel structure, a pixel defining layer 312, a reflection pattern 380, an encapsulation substrate 350, etc. Here, the semiconductor element 250 may include an active layer 130, a gate electrode 170, a source electrode 210, and a drain electrode 230, and the pixel structure may include a lower electrode 292, a light emitting layer 330, and an upper electrode 342. In addition, the dielectric mirror structure 200 may include a first dielectric layer 115, a second dielectric layer 150, and a third dielectric layer 190. Further, the reflection pattern 380 may include a first reflection pattern 382 and a second reflection pattern 384.

The planarization layer 274 may be disposed on the source and drain electrodes 210 and 230 and the third dielectric layer 190. The planarization layer 272 may have a first opening exposing third dielectric layer 190 in the first region 10. For example, the planarization layer 274 may be disposed as a relatively high thickness to sufficiently cover the source and drain electrodes 210 and 230, and the third dielectric layer 190. In this case, the planarization layer 274 may have a substantially even upper surface, and a planarization process may be further performed on the planarization layer 274 to further form the even upper surface of the planarization layer 274. The planarization layer 274 may include organic materials or inorganic materials. In example embodiments, the planarization layer 274 may include the organic materials.

The lower electrode 292 may be disposed in the first region 10 on the third dielectric layer 190 and in the third region 30 on the planarization layer 274. That is, the lower electrode 292 may cover an upper surface (e.g., an upper surface of the planarization layer 274 located in the third region 30) and a side wall (e.g., a side wall of the first opening of the planarization layer 274) of the planarization layer 274, and may be disposed on the third dielectric layer 190 located in the first region 10. For example, a thickness of the lower electrode 292 may be less than that of the upper electrode 342 such that a light emitted from the light emitting layer 330 is transmitted in the first direction D1. The lower electrode 292 may be in contact with the drain electrode 230 via a contact hole formed by removing a portion of the planarization layer 274. In addition, the lower electrode 292 may be electrically connected to the semiconductor element 250. The lower electrode 292 may be substantially transparent. For example, the lower electrode 292 may include a metal, a metal alloy, metal nitride, conductive metal oxide, transparent conductive materials, etc. In some example embodiments, the lower electrode 292 may have a multi-layered structure.

The pixel defining layer 312 may be disposed on a portion of the lower electrode 292 and the planarization layer 274 such that the lower electrode 292 located in the first region 10 is exposed. For example, the pixel defining layer 312 may extend in the inside of the first opening of the planarization layer 274 to cover both lateral portions of the lower electrode 292. The pixel defining layer 312 may have a second opening exposing the lower electrode 292 located in the first region 10 on the substrate 110. A size of the second opening may be less than that of the first opening. The light emitting layer 330 may be located on the lower electrode 292 where a portion of the lower electrode 292 is exposed by the pixel defining layer 312. The pixel defining layer 312 may include organic materials or inorganic materials. In example embodiments, the pixel defining layer 312 may include the organic materials.

Figure 17:
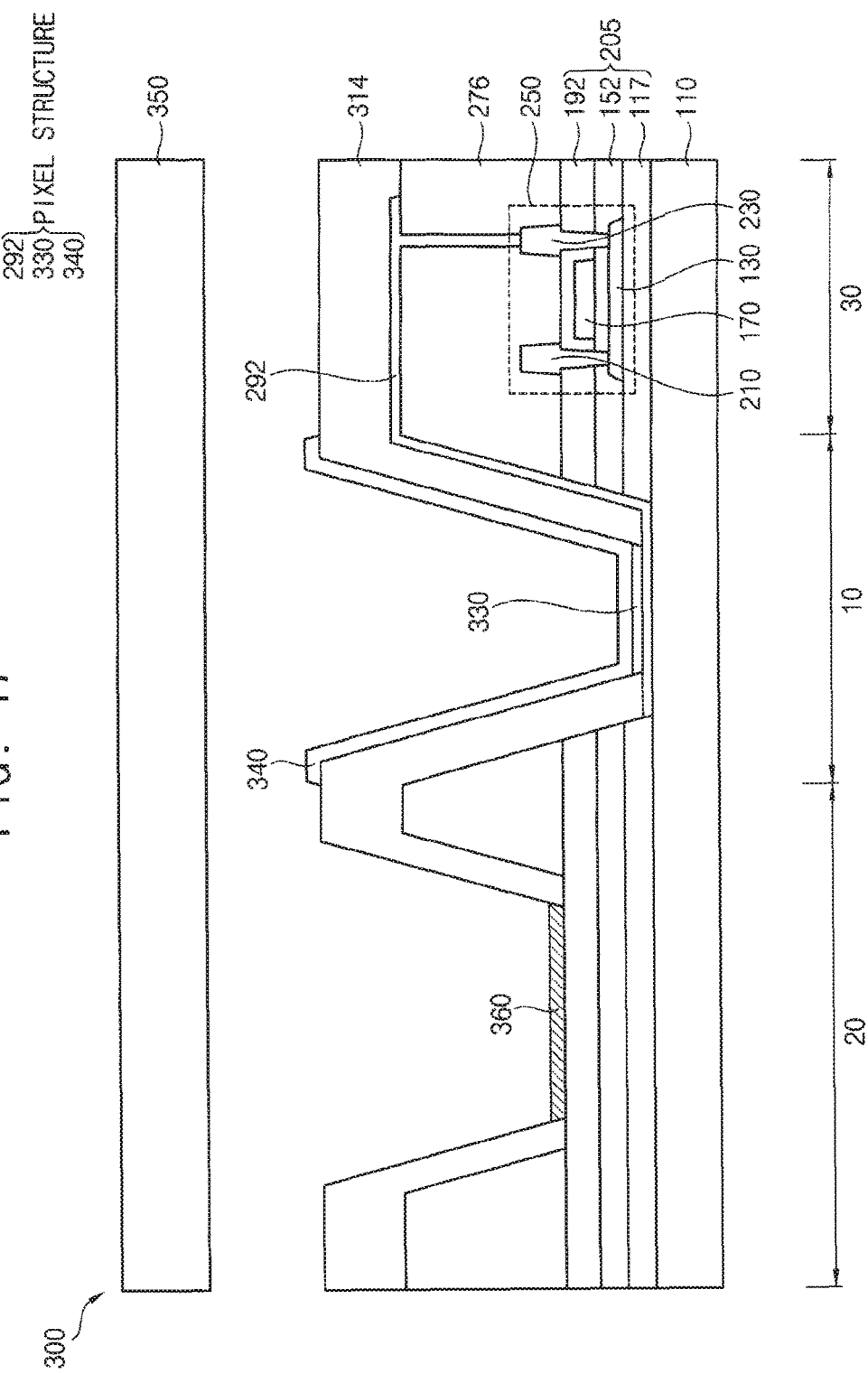
FIG. 17 is a cross-sectional view illustrating an OLED device in accordance with example embodiments.

FIG. 17 is a cross-sectional view illustrating an OLED device in accordance with example embodiments. An OLED device 300 illustrated in FIG. 17 may have a configuration substantially the same as or similar to that of an OLED devices described with reference to FIGS. 1 and 16 except a dielectric mirror structure 205, a planarization layer 276 and a pixel defining layer 314. In FIG. 17, detailed descriptions for elements that are substantially the same as or similar to elements described with reference to FIGS. 1 and 16 may not be repeated.

Referring to FIGS. 1, 16 and 17, an OLED device 300 may include a substrate 110, a dielectric mirror structure 205, a semiconductor element 250, a planarization layer 276, a pixel structure, a pixel defining layer 314, a reflection pattern 360, an encapsulation substrate 350, etc. Here, the semiconductor element 250 may include an active layer 130, a gate electrode 170, a source electrode 210, and a drain electrode 230, and the pixel structure may include a lower electrode 292, a light emitting layer 330, and an upper electrode 340. In addition, the dielectric mirror structure 205 may include a first dielectric layer 117, a second dielectric layer 152, and a third dielectric layer 192.

The first dielectric layer 117 may be disposed on the substrate 110. The first dielectric layer 117 may expose a portion of the first region 10 on the substrate 110.

The second dielectric layer 152 may be disposed on the first dielectric layer 117 and the active layer 130. The second dielectric layer 152 may expose a portion of the first region 10 on the substrate 110.

The third dielectric layer 192 may be disposed on the second dielectric layer 152 and the gate electrode 170. The third dielectric layer 192 may expose a portion of the first region 10 on the substrate 110.

The planarization layer 276 may be disposed on the third dielectric layer 192, the source electrode 210, and the drain electrode 230. The planarization layer 276 may have a first opening exposing the substrate 110 in the first region 10.

The lower electrode 292 may be disposed in the first region 10 on the substrate 110 and in the third region 30 on the planarization layer 276. That is, the lower electrode 292 may cover an upper surface (e.g., an upper surface of the planarization layer 276 located in the third region 30) and a side wall (e.g., a side wall of the first opening of the planarization layer 276) of the planarization layer 276, and may be disposed on the substrate 110 located in the first region 10.

The pixel defining layer 314 may expose the lower electrode 292 located in the first region 10 and the third dielectric layer 192 located in the second region 20.

The reflection pattern 360 and the upper electrode 340 may be simultaneously formed using the same materials.

In the OLED device 300 according to example embodiments, a light emitted from the light emitting layer 330 does not passes through the dielectric mirror structure 205, and pass through the substrate 110 in the first direction D1. Accordingly, a definition of the OLED device 300 may be improved.

Figure 18:
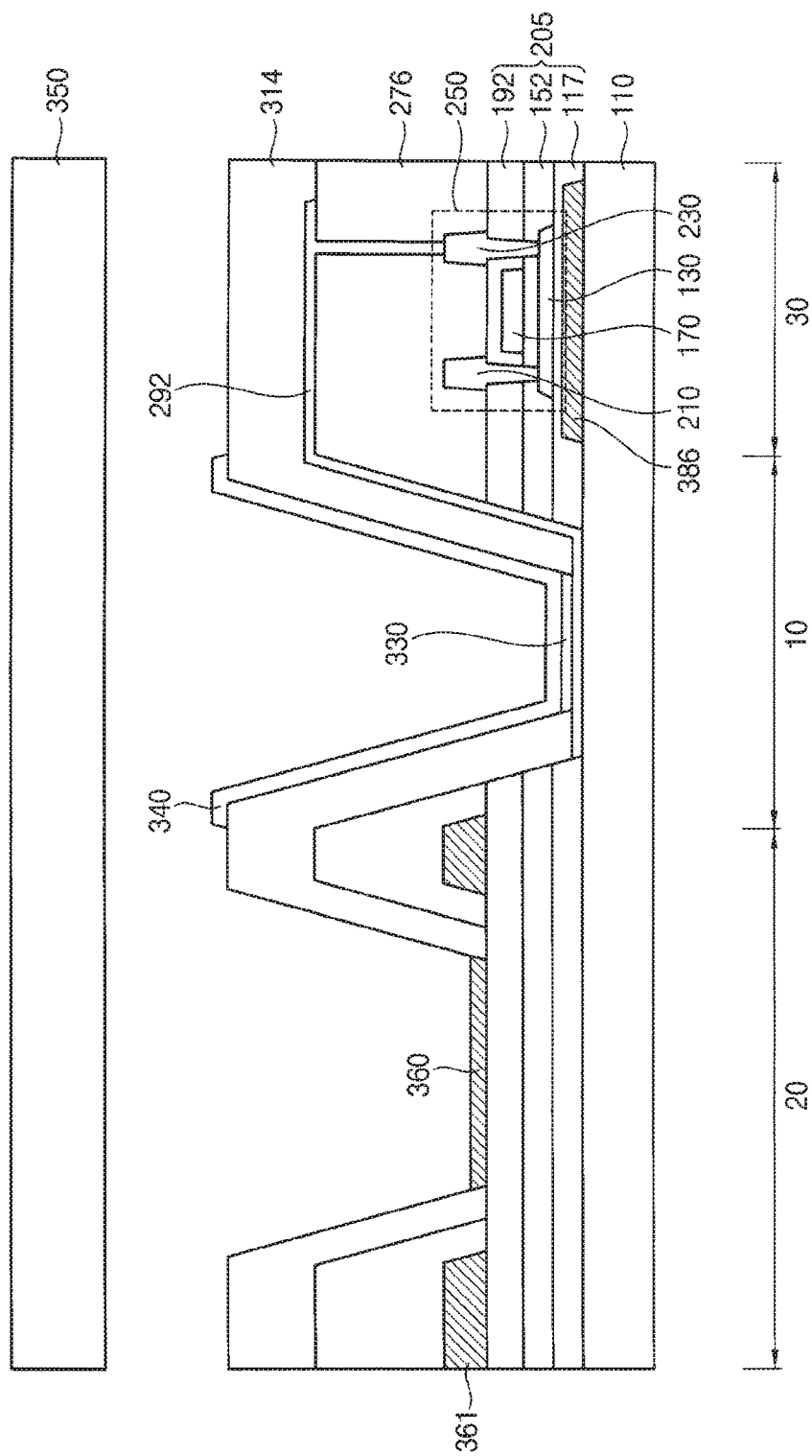
FIG. 18 is a cross-sectional view illustrating an OLED device in accordance with example embodiments.

FIG. 18 is a cross-sectional view illustrating an OLED device in accordance with example embodiments. An OLED device illustrated in FIG. 18 may have a configuration substantially the same as or similar to that of an OLED device described with reference to FIGS. 1 and 17 except a first sub-reflection pattern 361 and a second sub-reflection pattern 386. In FIG. 18, detailed descriptions for elements that are substantially the same as or similar to elements described with reference to FIGS. 1 and 17 may not be repeated.

Referring to FIGS. 1, 17 and 18, an OLED device may include a substrate 110, a dielectric mirror structure 205, a semiconductor element 250, a planarization layer 276, a pixel structure, a pixel defining layer 314, a reflection pattern 360, a first sub-reflection pattern 361 and a second sub-reflection pattern 386, an encapsulation substrate 350, etc. Here, the semiconductor element 250 may include an active layer 130, a gate electrode 170, a source electrode 210, and a drain electrode 230, and the pixel structure may include a lower electrode 292, a light emitting layer 330, and an upper electrode 340. In addition, the dielectric mirror structure 205 may include a first dielectric layer 117, a second dielectric layer 152, and a third dielectric layer 192.

The first sub-reflection pattern 361 may be disposed in the second region 20 on the third dielectric layer 192, and the second sub-reflection pattern 386 may be disposed in the third region 30 on the substrate 110.

As the OLED device according to example embodiments includes the first sub-reflection pattern 361 and the second sub-reflection pattern 386, a reflectivity of the OLED device may be relatively increased.

The inventive concept may be applied to various display devices including an organic light emitting display device. For example, the inventive concept may be applied to vehicle-display device, a ship-display device, an aircraftdisplay device, portable communication devices, display devices for display or for information transfer, a medical-display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting display (OLED) device, comprising:
   a substrate including a first region and a second region adjacent to the first region;
   a dielectric mirror structure on the substrate;
   a reflection pattern in the second region and on the substrate;
   a pixel structure in the first region and on the substrate, wherein the dielectric mirror structure is disposed under the reflection pattern, and the pixel structure does not overlap the reflection pattern.

2. The OLED device of claim 1, wherein the dielectric mirror structure includes:
   a first dielectric layer on the substrate, the first dielectric layer having a first refractive index;
   a second dielectric layer on the first dielectric layer, the second dielectric layer having the second refractive index that is different from the first refractive index; and
   a third dielectric layer on the second dielectric layer, the third dielectric layer having the first refractive index.

3. The OLED device of claim 2, wherein the substrate further includes a third region adjacent to the first region, and
   wherein the first region is located between the second region and the third region.

4. The OLED device of claim 3, further comprising:
   a semiconductor element in the third region and on the substrate, wherein the semiconductor element includes:
   an active layer between the first dielectric layer and the second dielectric layer;
   a gate electrode between the second dielectric layer and the third dielectric layer; and source and drain electrodes on the third dielectric layer.

5. The OLED device of claim 4, wherein the reflection pattern and the gate electrode are located at the same level, and are simultaneously formed using the same material.

6. The OLED device of claim 5, further comprising:
   a color filter in the first region on the third dielectric layer, the color filter overlapping the pixel structure.

7. The OLED device of claim 4, wherein the reflection pattern and the source and drain electrodes are located at the same level, and are simultaneously formed using the same materials.

8. The OLED device of claim 7, further comprising:
   a color filter in the first region on the third dielectric layer, the color filter overlapping the pixel structure.

9. The OLED device of claim 4, wherein the reflection pattern includes:
   a first reflection pattern in the second region between the substrate and the first dielectric layer; and
   a second reflection pattern in the third region between the substrate and the first dielectric layer.

10. The OLED device of claim 9, wherein the first and second reflection layers are integrally formed, and have a mesh structure including an opening that exposes the first region.

11. The OLED device of claim 9, wherein the first and second reflection patterns are spaced apart from each other, and each of the first and second reflection patterns has a planar shape.

12. The OLED device of claim 10, further comprising:
    a color filter in the first region and on the third dielectric layer, the color filter overlapping the pixel structure.

13. An organic light emitting display (OLED) device, comprising:
    a substrate including a first region and a second region adjacent to the first region;
    a dielectric mirror structure on the substrate;
    a reflection pattern in the second region and on the substrate; and
    a pixel structure in the first region and on the substrate, wherein the pixel structure includes:
      a lower electrode on the dielectric mirror structure, the lower electrode being light-transmissive;
      a light emitting layer on the lower electrode; and
      an upper electrode on the light emitting layer, the upper electrode being reflective and positioned to reflect light emitted from the light emitting layer.

14. The OLED device of claim 13, wherein the upper electrode is disposed in the first region but not in the second region, and
    wherein the reflection pattern is disposed in the second region on the dielectric mirror structure, and the upper electrode and the reflection pattern are simultaneously formed using the same material.

15. The OLED device of claim 13, wherein the reflection pattern overlaps the dielectric mirror structure in the second region, and the upper electrode extends in a direction from the first region into the second region, and
    wherein the upper electrode and the reflection pattern are integrally formed using the same material.

16. The OLED device of claim 13, wherein the reflection pattern is disposed in the second region on the dielectric mirror structure, and the upper electrode extends in a direction from the first region into the second region, and
    wherein the upper electrode is disposed on the reflection pattern, and the lower electrode and the reflection pattern are simultaneously formed using the same material.

17. An organic light emitting display (OLED) device, comprising:
    a substrate including a first region and a second region adjacent to the first region;
    a dielectric mirror structure on the substrate;
    a reflection pattern in the second region and on the substrate; and
    a pixel structure in the first region and on the substrate, wherein the pixel structure includes:
      a lower electrode on the substrate, the lower electrode being light-transmissive;
      a light emitting layer on the lower electrode; and an upper electrode on the light emitting layer, the upper electrode being reflective and positioned to reflect light emitted from the light emitting layer, and wherein the dielectric mirror structure is disposed in the second region, and exposes the first region.

18. The OLED device of claim 17, wherein the upper electrode is disposed in the first region, and exposes the second region, and wherein the reflection pattern is disposed in the second region and on the dielectric mirror structure, and the upper electrode and the reflection pattern are simultaneously formed using the same material.

19. The OLED device of claim 17, wherein the substrate further includes a third region adjacent to the first region, and wherein the first region is located between the second region and the third region.

20. The OLED device of claim 19, further comprising:

a sub-reflection pattern in the third region on the substrate; and a semiconductor element on the sub-reflection pattern.

* * * * *